US011355070B2

(12) United States Patent
Yuan et al.

(10) Patent No.: US 11,355,070 B2
(45) Date of Patent: Jun. 7, 2022

(54) SHIFT REGISTER UNIT, GATE DRIVING CIRCUIT AND CONTROL METHOD THEREOF AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Zhidong Yuan, Beijing (CN); Yongqian Li, Beijing (CN); Can Yuan, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/964,712

(22) PCT Filed: Jan. 3, 2020

(86) PCT No.: PCT/CN2020/070210
§ 371 (c)(1),
(2) Date: Jul. 24, 2020

(87) PCT Pub. No.: WO2020/177473
PCT Pub. Date: Sep. 10, 2020

(65) Prior Publication Data
US 2021/0125564 A1    Apr. 29, 2021

(30) Foreign Application Priority Data
Mar. 1, 2019  (CN) .......................... 201910159457.X

(51) Int. Cl.
*G11C 19/00*  (2006.01)
*G09G 3/3266*  (2016.01)
(Continued)

(52) U.S. Cl.
CPC .......... *G09G 3/3266* (2013.01); *G11C 19/28* (2013.01); *G09G 3/3233* (2013.01);
(Continued)

(58) Field of Classification Search
CPC ... G09G 2310/0286; G09G 2310/0267; G09G 2310/08; G09G 3/3266; G09G 2300/0426;
(Continued)

(56) References Cited

U.S. PATENT DOCUMENTS 7,859,507 B2  12/2010  Jang et al.
9,305,509 B2  4/2016  Li et al.
(Continued)

FOREIGN PATENT DOCUMENTS

CN     103208251 A      7/2013
CN     103474040 A     12/2013
(Continued)

OTHER PUBLICATIONS

First Office Action, including Search Report, for Chinese Patent Application No. 201910159457.X, dated Apr. 7, 2020, 16 pages.

*Primary Examiner* — Duc Q Dinh
(74) *Attorney, Agent, or Firm* — Westman, Champlin & Koehler, P.A.

(57) ABSTRACT

Provided are a shift register unit and a control method thereof, a gate driving circuit and a control method thereof, and a display apparatus. The shift register unit may include: a first shift register coupled to an input signal terminal, a first clock signal terminal and a second clock signal terminal. The first shift register is configured to generate a first output signal based on the signal at the first clock signal terminal and generate a second output signal based on the signal at the second clock signal terminal; and a second shift register coupled to the input signal terminal and a third clock signal
(Continued)

terminal, the second shift register is configured to generate a third output signal based on the signal at the third clock signal terminal; and a pull-up node of the first shift register is coupled to a pull-up node of the second shift register.

19 Claims, 14 Drawing Sheets

(51) Int. Cl.
 *G11C 19/28* (2006.01)
 *G09G 3/3233* (2016.01)
(52) U.S. Cl.
 CPC ............... *G09G 2310/0286* (2013.01); *G09G 2310/061* (2013.01); *G09G 2310/08* (2013.01)
(58) Field of Classification Search
 CPC ........... G09G 3/3674; G09G 2310/061; G09G 2330/021; G09G 3/3696; G11C 19/28; G11C 19/287; G11C 19/184; G11C 19/182; G11C 7/1051; G11C 7/1036
 See application file for complete search history.

(56) References Cited

U.S. PATENT DOCUMENTS

| | | | |
|---|---|---|---|
| 9,721,510 B2 | 8/2017 | Xu | |
| 10,170,044 B2 | 1/2019 | Park et al. | |
| 10,217,428 B2 | 2/2019 | Fan et al. | |
| 10,852,867 B2* | 12/2020 | Wu | ............ G09G 3/20 |
| 2007/0001991 A1 | 1/2007 | Jang et al. | |
| 2011/0002437 A1* | 1/2011 | Su | ............ G11C 19/28 |
| | | | 377/64 |
| 2011/0058642 A1* | 3/2011 | Tsai | ........ G11C 19/28 |
| | | | 377/79 |
| 2015/0243237 A1 | 8/2015 | Li et al. | |
| 2016/0012764 A1 | 1/2016 | Xu | |
| 2017/0061865 A1 | 3/2017 | Park et al. | |
| 2017/0330526 A1 | 11/2017 | Fan et al. | |
| 2018/0204520 A1 | 7/2018 | Kobayashi | |
| 2018/0336957 A1* | 11/2018 | Mi | ......... G11C 19/287 |
| 2019/0006018 A1 | 1/2019 | Fang et al. | |
| 2020/0258463 A1 | 8/2020 | Kim et al. | |

FOREIGN PATENT DOCUMENTS

| | | |
|---|---|---|
| CN | 105096865 A | 11/2015 |
| CN | 105225635 A | 1/2016 |
| CN | 105243995 A | 1/2016 |
| CN | 106486059 A | 3/2017 |
| CN | 106601175 A | 4/2017 |
| CN | 108346402 A | 7/2018 |
| CN | 109920380 A | 6/2019 |
| JP | 2007011336 A | 1/2007 |
| KR | 1020160073928 A | 6/2016 |

* cited by examiner

SHIFT REGISTER UNIT, GATE DRIVING CIRCUIT AND CONTROL METHOD THEREOF AND DISPLAY APPARATUS

CROSS-REFERENCE TO RELATED APPLICATION

This application is a Section 371 National Stage Application of International Application No. PCT/CN2020/070210 filed on Jan. 3, 2020, entitled "SHIFT REGISTER UNIT, GATE DRIVING CIRCUIT AND CONTROL METHOD THEREOF AND DISPLAY APPARATUS", which claims priority to Chinese Patent Application No. 201910159457.X, filed on Mar. 1, 2019, the disclosures of which are incorporated herein by reference in their entireties.

TECHNICAL FIELD

The present disclosure relates to the field of display technology, and particularly to a shift register unit, a gate driving circuit and a control method thereof, and a display apparatus.

BACKGROUND

In an OLED display apparatus, a gate driving circuit includes multiple stages of shift register units, and each stage of the shift register unit drives a row of pixels, which results in a complicated circuit structure of the shift register. It is difficult to arrange such a complicated gate driving circuit in the limited space, because the space for arranging the gate driving circuit on the display apparatus is limited.

SUMMARY

Embodiments of the present disclosure provide a shift register unit and its control method, a gate drive circuit and its control method, and a display apparatus.

According to one aspect of an embodiment of the present disclosure, a shift register unit, comprising: a first shift register coupled to an input signal terminal, a first clock signal terminal and a second clock signal terminal, the first shift register is configured to generate a first output signal based on the signal at the first clock signal terminal and generate a second output signal based on the signal at the second clock signal terminal under a control of the signal at the input signal terminal; and a second shift register coupled to the input signal terminal and a third clock signal terminal, the second shift register is configured to generate a third output signal based on the signal at the third clock signal terminal under the control of the signal at the input signal terminal; wherein a pull-up node of the first shift register is coupled to a pull-up node of the second shift register.

For example, the first shift register comprises: a first control circuit coupled to the input signal terminal and a reset signal terminal, the first control circuit is configured to control the potential at the pull-up node and the potential at the pull-down node of the first shift register according to the signals of the input signal terminal and the reset signal terminal; a first output circuit coupled to the first clock signal terminal and the pull-up node of the first shift register and the pull-down node of the first shift register, the first output circuit is configured to generate the first output signal based on the signal at the first clock signal terminal under a control of the potential at the pull-up node of the first shift register and the pull-down node of the first shift register; and a second output circuit coupled to the second clock signal terminal and the pull-up node of the first shift register and the pull-down node of the first shift register, the second output circuit is configured to generate the second output signal based on the signal at the second clock signal terminal under the control of the potential at the pull-up node of the first shift register and the pull-down node of the first shift register.

For example, the second shift register comprises: a second control circuit coupled to the input signal terminal and the reset signal terminal, and the second control circuit is configured to control the potential at the pull-up node of the second shift register and the potential at the pull-down node of the second shift register according to the signals of the input signal terminal and the reset signal terminal; and a third output circuit coupled to the third clock signal terminal, the pull-up node of the second shift register and the pull-down node of the second shift register, the third output circuit is configured to generate the third output signal based on the signal at the third clock signal terminal under a control of the potential at the pull-up node of the second shift register and the potential at the pull-down node of the second shift register.

For example, a shift register unit further comprises: a third control circuit coupled to a first control signal terminal, a second control signal terminal and the input signal terminal, the third control circuit is configured to control the potential at the pull-up node of the first shift register and the pull-up node of the second shift register under a control of the signals of the input signal terminal, the first control signal terminal and the second control signal terminal.

For example, the first output circuit comprises a first transistor and a second transistor, wherein a gate of the first transistor is coupled to the pull-up node of the first shift register, a first electrode of the first transistor is coupled to the first clock signal terminal, and a second electrode of the first transistor is coupled to a first output signal terminal for outputting the first output signal, a gate of the second transistor is coupled to the pull-down node of the first shift register, a first electrode of the second transistor is coupled to the reference signal terminal, and a second electrode of the second transistor is coupled to the first output signal terminal; the second output circuit comprises a third transistor and a fourth transistor, wherein a gate of the third transistor is coupled to the pull-up node of the first shift register, a first electrode of the third transistor is coupled to the second clock signal terminal, and a second electrode of the third transistor is coupled to a second output signal terminal for outputting the second output signal, a gate of the fourth transistor is coupled to the pull-down node of the first shift register, a first electrode of the fourth transistor is coupled to the reference signal terminal, and a second electrode of the fourth transistor is coupled to the second output signal terminal.

For example, the third output circuit comprises a fifth transistor and a sixth transistor, a gate of the fifth transistor is coupled to the pull-up node of the second shift register, a first electrode of the fifth transistor is coupled to the third clock signal terminal, and a second electrode of the fifth transistor is coupled to a third output signal terminal for outputting the third output signal, a gate of the sixth transistor is coupled to the pull-down node of the second shift register, a first electrode of the sixth transistor is coupled to the reference signal terminal, and a second electrode of the sixth transistor is coupled to the third output signal terminal.

For example, the third control circuit comprises a seventh transistor, an eighth transistor, and a capacitor, a gate of the seventh transistor is coupled to a first end of the capacitor, a first electrode of the seventh transistor is coupled to the second control signal terminal and a second end of the capacitor, a second electrode of the seventh transistor is coupled to the pull-up node of the first shift register and the pull-up node of the second shift register, and a gate of the eighth transistor is coupled to the first control signal terminal, a first electrode of the eighth transistor is coupled to the input signal terminal, and a second electrode of the eighth transistor is coupled to the gate of the seventh transistor.

For example, the third control circuit comprises a seventh transistor, an eighth transistor, and a capacitor, a first end of the capacitor is coupled to the second control signal terminal, and a second end of the capacitor is coupled to a gate of the seventh transistor, a first electrode of the seventh transistor is coupled to the power signal terminal, and a second electrode of the seventh transistor is coupled to the pull-up node of the first shift register and the pull-up node of the second shift register, a gate of the eighth transistor is coupled to the first control signal terminal, a first electrode of the eighth transistor is coupled to the input signal terminal, and a second electrode of the eighth transistor is coupled to the gate of the seventh transistor.

According to another aspect of an embodiment of the present disclosure, a gate driving circuit comprising N stages of cascaded shift register units described above is provided, wherein, an input signal terminal of the $n^{th}$ stage of the shift register unit is coupled to a second output signal terminal of the $(n-1)^{th}$ stage of the shift register unit, and a reset signal terminal of the $n^{th}$ stage of the shift register unit is coupled to a second output signal terminal of the $(n+1)^{th}$ stage of the shift register unit, wherein, n and N are integers, $N \geq 4$, and $2 \leq n \leq N-1$; and the N stages of cascaded shift register units comprises multiple groups of shift register units, and each group of shift register units comprises a cascaded first shift register unit, second shift register unit, third shift register unit, and fourth shift register unit, wherein a first clock signal terminal of the second shift register unit and a first clock signal terminal of the fourth shift register unit are coupled to receive a first clock signal, and a second clock signal terminal of the second shift register unit and a second clock signal terminal of the fourth shift register unit are coupled to receive a second clock signal, a third clock signal terminal of the second shift register unit and a third clock signal terminal of the fourth shift register unit are coupled to receive a third clock signal; and a first clock signal terminal of the first shift register unit and a first clock signal terminal of the third shift register unit are coupled to receive a fourth clock signal, a second clock signal terminal of the first shift register unit and a second clock signal terminal of the third shift register unit are coupled to receive a fifth clock signal, a third clock signal terminal of the first shift register unit and a third clock signal terminal of the third shift register unit are coupled to receive a sixth clock signal.

According to another aspect of an embodiment of the present disclosure, a display apparatus comprising the gate driving circuit described above is provided.

For example, the display apparatus further comprises a plurality of pixel units arranged in 2*N rows, each pixel unit having a first control terminal and a second control terminal, wherein a $n^{th}$ stage of the shift register unit is coupled to a $(2n-1)^{th}$ row of the pixel unit and a $2n^{th}$ row of the pixel unit, wherein a first output signal terminal of the $n^{th}$ stage of the shift register unit is coupled to a first control terminal of the $(2n-1)^{th}$ row of the pixel unit, a second output signal terminal of the $n^{th}$ stage of the shift register unit is coupled to a second control terminal of the $(2n-1)^{th}$ row of the pixel unit and a second control terminal of the $2n^{th}$ row of the pixel unit, a third output signal terminal of the $n^{th}$ stage of the shift register unit is coupled to a first control terminal of the $2n^{th}$ row of the pixel unit.

According to another aspect of an embodiment of the present disclosure, a method of controlling a shift register unit described above is provided, the method comprises: applying an input signal to an input signal terminal, applying a first clock signal to a first clock signal terminal, and applying a second clock signal to a second clock signal terminal, so that a first shift register generates a first output signal based on the first clock signal and generates a second output signal based on the second clock signal under the control of the input signal; and applying a third clock signal to a third clock signal terminal, so that a second shift register generates a third output signal based on the third clock signal under the control of the input signal.

For example, in the display phase, the first clock signal, the second clock signal, and the third clock signal are pulse signals having the same period, and both a pulse width of the first clock signal and the third clock signal are half of a pulse width of the second clock signal, so that the second output signal generated by the shift register unit coincides with an overlapping of the first output signal and the third output signal.

For example, the display phase comprises a first period, a second period, and a third period, wherein during the first period, the input signal is at a first level so as to pull up both a potential at a pull-up node of the first shift register and a pull-up node of the second shift register to a first potential; during the second period, the first clock signal and the second clock signal are at a first level, and the potential at the pull-up node of the first shift register causes the first shift register to output the first output signal at the first level and the second output signal at the first level; and during the third period, the second clock signal maintains at the first level, the first clock signal changes from being at the first level to being at a second level, and the third clock signal is at the first level, the potential at the pull-up node of the first shift register causes the first shift register to output the second output signal at the first level and the first output signal at the second level, and the potential at the pull-up node of the second shift register causes the second shift register to output the third output signal at the first level.

For example, the shift register unit further comprises a third control circuit, the method further comprising: applying a first control signal to the first control signal terminal, and applying a second control signal to the second control signal terminal so that in response to the input signal and the second control signal being at the first level at the same time in the display phase, the shift register unit is controlled to generate the first output signal, the second output signal and the third output signal as sensing control signals in the blanking phase.

For example, in the display phase, in at least a portion of the period that the input signal and the second control signal are both at the first level, the first control signal is at the first level, so that the third control circuit stores voltage; and in the blanking phase, the third control circuit uses the stored voltage to control the shift register unit to generate the first output signal, the second output signal, and the third output signal as sensing control signals.

For example, the blanking phase comprises a fourth period and a fifth period, and the shift register unit is controlled to generate the first output signal, the second output signal, and the third output signal as sensing control signals in the blanking phase comprising: in the fourth period of the blanking phase, the second control signal is at a first level, and the first control signal is at a third level lower than the second level, so that the third control circuit uses the stored voltage to pull up the potential at the pull-up node of the first shift register and the pull-up node of the second shift register to the first potential; in the fifth period of the blanking phase, the second control signal is at a second level, the first control signal is at a third level lower than the second level, and the potential at pull-up node of the first shift register causes the first shift register to output the signal at the first clock signal terminal as the first output signal and the signal at the second clock signal terminal as the second output signal, and the potential at the pull-up node of the second shift register causes the second shift register to output the signal at the third clock signal terminal as the third output signal.

For example, a duration of the fourth period is greater than a duration of the first period.

According to another aspect of an embodiment of the present disclosure, a method of controlling a gate driving circuit described above is provided, comprising: applying a first clock signal, a second clock signal, a third clock signal, a fourth clock signal, a fifth clock signal, and a sixth clock signal to the gate driving circuit, so that each shift register unit generates a first output signal, a second output signal, and a third output signal, wherein the first output signal, the second output signal, and the third output signal generated by a $(n+1)^{th}$ stage of the shift register unit are respectively shifted relative to the first output signal, the second output signal, and the third output signal generated by the $n^{th}$ stage of the shift register unit; and the second output signal generated by each shift register unit coincides with an overlapping of the first output signal and the third output signal generated by the same shift register unit.

For example, in the display phase, the first clock signal, the second clock signal and the third clock signal are pulse signals having the same period, and both a pulse width of the first clock signal and the third clock signal are half of a pulse width of the second clock signal; a waveform of the fifth clock signal is the same as a waveform of the second clock signal, and the fifth clock signal has a half-cycle shift relative to the second clock signal; a waveform of the fourth clock signal is the same as a waveform of the first clock signal, and the fourth clock signal has a half-cycle shift relative to the first clock signal; and a waveform of the sixth clock signal is the same as a waveform of the third clock signal, and the sixth clock signal has a half-cycle shift relative to the third clock signal.

For example, for each shift register unit, the display phase comprises a first period, a second period, and a third period, wherein in the first period, the input signal terminal is at a first potential to pull up the potential at the pull-up node of the first shift register and the pull-up node of the second shift register to the first potential; in the second period, the first clock signal terminal and the second clock signal terminal are at the first potential, and the potential at the pull-up node of the first shift register causes the first shift register to output the first output signal at the first level and the second output signal at the first level; in the third period, the second clock signal terminal maintains at the first potential, the first clock signal terminal changes from being at the first potential to being at the second potential, and the third clock signal terminal is at the first potential, the potential at the pull-up node of the first shift register causes the first shift register to output the second output signal at the first level and the first output signal at the second level, and the potential at the pull-up node of the second shift register causes the second shift register to output the third output signal at the first level.

For example, each shift register unit further comprises a third control circuit, the method further comprising: applying a first control signal and a second control signal to the third control circuit of each shift register unit, so that in response to a input signal and the second control signal applied to one of the shift register units being at the first level at the same time in the display phase, the shift register unit is controlled to generate the first output signal, the second output signal, and the third output signal as sensing control signals in the blanking phase.

For example, for each shift register unit, in the display phase, in at least a portion of the period that the input signal terminal and the second control signal terminal are both at the first potential, the first control signal terminal is at the first potential, so that the third control circuit of the shift register unit stores voltage; and in the blanking phase, the third control circuit of the shift register unit uses the stored voltage to control the shift register unit to generate the first output signal, the second output signal, and the third output signal as sensing control signals.

For example, the blanking phase comprises a fourth period and a fifth period, and the shift register unit is controlled to generate a first output signal, a second output signal and a third output signal as sensing control signals in the blanking phase comprising: for the shift register unit, in the fourth period of the blanking phase, the second control signal is at a first level, and the first control signal is at a third level lower than the second level, so that the third control circuit of the shift register unit uses the stored voltage to pull up both a potential at a pull-up node of the first shift register and a potential at a pull-up node of the second shift register of the shift register unit to the first potential; in the fifth period of the blanking phase, the second control signal is at a second level, the first control signal is at a third level lower than the second level, and the potential at pull-up node of the first shift register causes the first shift register to output the signal at the first clock signal terminal as the first output signal and the signal at the second clock signal terminal as the second output signal, and the potential at the pull-up node of the second shift register causes the second shift register to output the signal at the third clock signal terminal as the third output signal.

For example, in the fifth period of the blanking phase of one frame of the two adjacent frames, the fifth clock signal is at the second level, the fourth clock signal is at the first level in the beginning phase of the fifth period and in the first half of the ending phase of the fifth period, and the sixth clock signal is at the first level in the first half of the beginning phase of the fifth period and the second half of the ending phase of the fifth period, the second clock signal is at the first level, the first clock signal is the same as the fourth clock signal, and the third clock signal is the same as the sixth clock signal; and in the fifth period of the blanking phase of the other frame of the two adjacent frames, the fifth clock signal is at the first level, the sixth clock signal is at the second level in the beginning phase of the fifth period and in the first half of the ending phase of the fifth period, and the fourth clock signal is at the first level in the first half of the beginning phase of the fifth period and in the second half of the ending phase of the fifth period, the second clock signal is at the first level, the first clock signal is the same as the fourth clock signal, and the third clock signal is the same as the sixth clock signal.

DETAILED DESCRIPTION OF EMBODIMENTS

Figure 1:
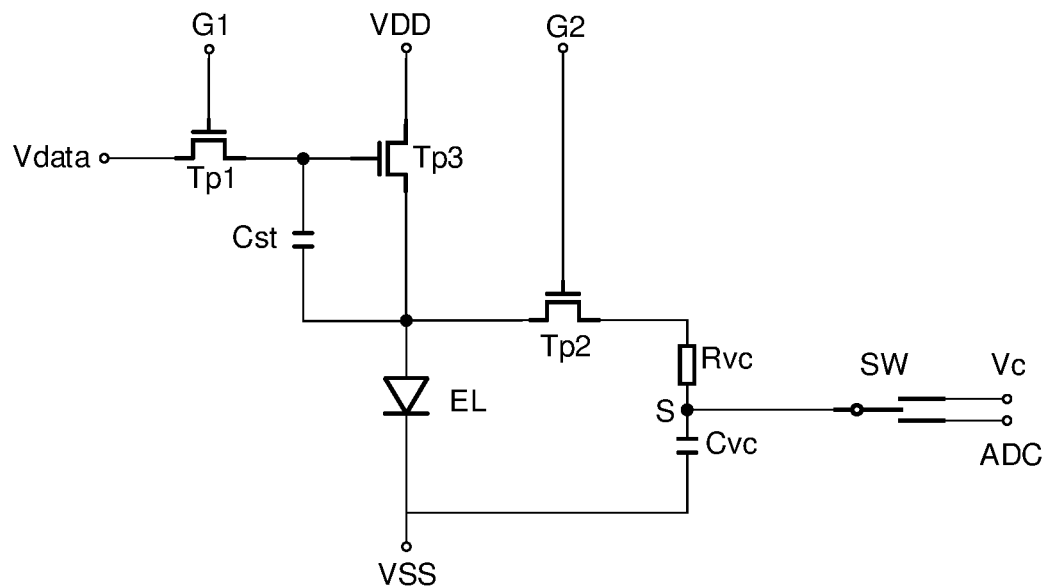
FIG. 1 shows a schematic diagram of a pixel circuit.

To make the objectives, technical solutions, and advantages of the embodiments of the present disclosure more clear, the technical solutions in the embodiments of the present disclosure will be described clearly and completely in conjunction with the drawings in the embodiments of the present disclosure. Obviously, the described embodiments are some, but not all of the embodiments of the present disclosure. Based on the described embodiments of the present disclosure, all other embodiments obtained by a person of ordinary skill in the art without creative labor fall within the protection scope of the present disclosure. It should be noted that the same elements are denoted by the same or similar reference signs throughout the drawings. In the following description, some specific embodiments are for descriptive purposes only, and should not be construed as limiting the present disclosure, but are merely examples of embodiments of the present disclosure. When it may cause confusion to the understanding of the present disclosure, the conventional structure or configuration will be omitted. It should be noted that the shapes and sizes of the components in the figures do not reflect the true sizes and proportions, but only illustrate the contents of the embodiments of the present disclosure.

Unless otherwise defined, the technical terms or scientific terms used in the embodiments of the present disclosure should have a common meaning understood by those skilled in the art. The terms "first", "second" and similar words used in the embodiments of the present disclosure do not represent any order, quantity or importance, but are only used to distinguish different components.

In addition, in the description of the embodiments of the present disclosure, the term "coupled" or "coupled to" may mean that two components are directly coupled, or may mean that two components are coupled via one or more other components. In addition, these two components can be connected or coupled through wired or wireless means.

In addition, in the description of the embodiments of the present disclosure, the terms "first level" and "second level" are only used to distinguish that the amplitudes of the two levels are different. For example, in the following description, the "first level" is a low level and the "second level" is a high level. Those skilled in the art can understand that the present disclosure is not limited thereto.

The transistors used in the embodiments of the present disclosure may all be thin film transistors, field effect transistors, or other devices with the same characteristics. For example, the thin film transistor used in the embodiment of the present disclosure may be an oxide semiconductor transistor. Since the source and drain of the switching thin film transistor used here are symmetrical, the source and drain can be interchanged. In the embodiment of the present disclosure, one of the source and the drain is called a first electrode, and the other of the source and the drain is called a second electrode. In the following example, an N-type thin film transistor is used as an example for description. Those skilled in the art can understand that the embodiments of the present disclosure can obviously be applied to the case of a P-type thin film transistor.

FIG. 1 shows a schematic structural diagram of a pixel circuit. As shown in FIG. 1, the pixel circuit has a 3T1C structure, that is, three transistors Tp1, Tp2, and Tp3 and two capacitors Cst and Cvc. The pixel circuit has a first control terminal G1, a second control terminal G2, and a data terminal Vdata. The pixel circuit is controlled by the gate driving signals at the first control terminal G1 and the second control terminal G2. A driving current is generated according to the data voltage at the data terminal Vdata to drive the light emitting element EL to emit light.

In the display driving process, for each pixel circuit, the current flowing through the driving transistor Tp3 is related to the threshold voltage of the driving transistor Tp3. If the threshold voltage changes, the current flowing through the driving transistor Tp3 will be deviated. Internal compensation or external compensation techniques can be used to compensate the influence of the threshold voltage on the drive current. For the external compensation technology, the blanking phase after the display phase in a frame can be used as a sensing period, in which a threshold voltage of the driving transistor Tp3 in a row of pixel circuits is sensed during the sensing period (for example, as shown in FIG. 1, the switch SW is used to sense the voltage at the node S), and in the subsequent display phase, the sensed threshold voltage is used to compensate the data voltage Vdata applied to the pixel circuits in the row, thereby compensating the influence of the threshold voltage of the driving transistor Tp3 on the drive current.

Figure 2:
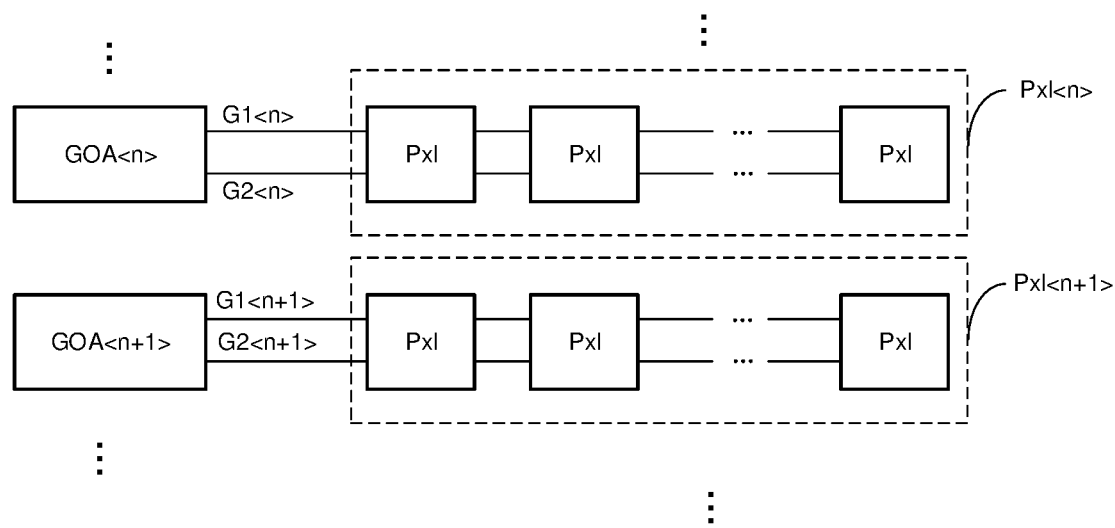
FIG. 2 shows a schematic diagram of a display apparatus.

FIG. 2 shows a schematic diagram of a display apparatus. The display apparatus of FIG. 2 includes a multi-stage shift register unit GOA and a plurality of rows of pixels Pxl, and each stage of the shift register unit GOA is coupled to a row of pixels Pxl. For example, in FIG. 2, the $n^{th}$ stage of the shift register unit GOA<n> is coupled to the $n^{th}$ row of the pixel Pxl<n> to provide the gate driving signal G1<n> to the first control terminal G1 of each pixel Pxl in the row, and provide the gate control signal G2<n> to the second control terminal G2 of each pixel Pxl in the row, and so on.

The embodiments of the present disclosure propose a shift register unit and control method thereof, a gate driving circuit and control method thereof, and a display apparatus. Three output signals are provided by using two shift registers, and the first and second output signals can be used to drive a row of pixels, and the second and third output signals can be used to drive another row of pixels, such that one shift register unit including two shift registers can drive two rows of pixels simultaneously, thereby saving the space occupied by the shift register unit and achieving high pixel density (PPI, Pixels Per Inch). On the other hand, by providing corresponding control methods, display and random sensing can be achieved, thereby achieving threshold voltage compensation.

The shift register unit according to the embodiment of the present disclosure will be described below with reference to FIGS. 3 to 7.

Figure 3:
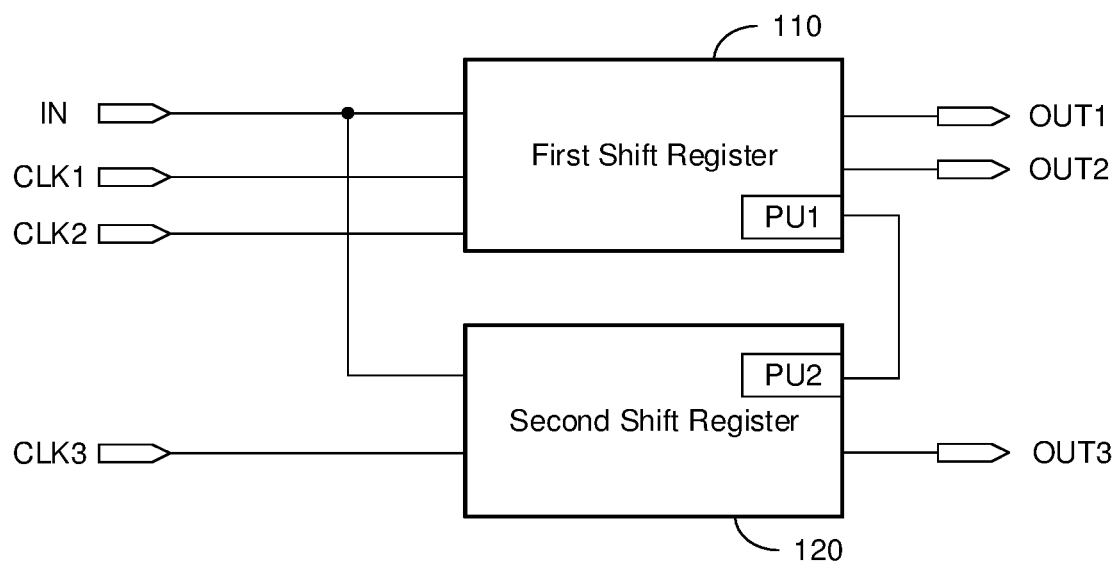
FIG. 3 shows a schematic block diagram of a shift register unit according to an embodiment of the present disclosure.

FIG. 3 shows a schematic block diagram of a shift register unit according to an embodiment of the present disclosure. As shown in FIG. 3, the shift register unit 100 includes a first shift register 110 and a second shift register 120.

The first shift register 110 is coupled to an input signal terminal IN, a first clock signal terminal CLK1, and a second clock signal terminal CLK2. The first shift register 110 may generate a first output signal based on the signal at the first clock signal terminal CLK1 under the control of the signal at the input signal terminal IN to output at the first output signal terminal OUT1, and generate a second output signal based on the signal at the second clock signal terminal CLK2 to output at the second output signal terminal OUT2.

The second shift register 120 is coupled to the input signal terminal IN and a third clock signal terminal CLK3. The second shift register 120 may generate a third output signal based on the signal at the third clock signal terminal CLK3 under the control of the signal at the input signal terminal IN to output at the third output signal terminal OUT3.

The pull-up node PU1 of the first shift register 110 is coupled to the pull-up node PU2 of the second shift register.

Figure 4:
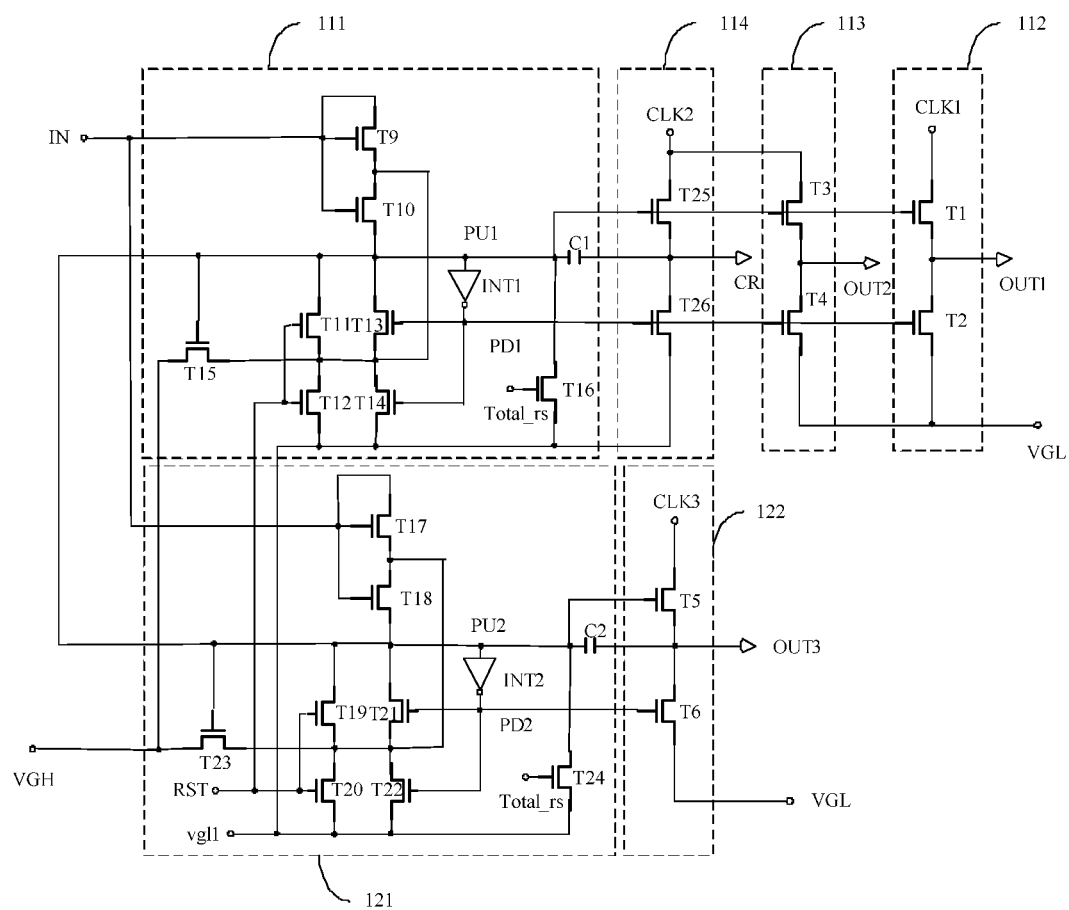
FIG. 4 shows an example circuit diagram of a shift register unit of FIG. 3.

FIG. 4 shows an example circuit diagram of the shift register unit of FIG. 3.

As shown in FIG. 4, the shift register unit 100' may include a first shift register and a second shift register. The pull-up node PU1 of the first shift register is coupled to the pull-up node PU2 of the second shift register, that is, the first shift register and the second shift register share the pull-up node. The first shift register and the second shift register may also share the input signal terminal IN and the reset signal terminal RST. The first shift register and the second shift register may also share the power supply signal terminal VGH, the reference signal terminal VGL, and the total reset signal terminal Total_rs.

The first shift register includes a first control circuit 111, a first output circuit 112, and a second output circuit 113. The first control circuit 111 is coupled to the input signal terminal IN and the reset signal terminal RST. The first control circuit 111 may control the potentials of the pull-up node PU1 and the pull-down node PD1 of the first shift register according to the signals of the input signal terminal IN and the reset signal terminal RST. The first output circuit 112 is coupled to the first clock signal terminal CLK1, the pull-up node PU1 and the pull-down node PD1 of the first shift register, and the output signal terminal OUT1. The first output circuit 112 may generate a first output signal based on the signal at the first clock signal terminal CLK1 under the control of the potentials of the pull-up node PU1 and the pull-down node PD1 of the first shift register to output at the first output signal terminal OUT1. The second output circuit 113 is coupled to the second clock signal terminal CLK2, the pull-up node PU1 and the pull-down node PD1 of the first shift register 110, and the output signal terminal OUT2. The second output circuit 113 may generate a second output signal based on the signal at the second clock signal terminal CLK2 under the control of the potentials of the pull-up node PU1 and the pull-down node PD1 of the first shift register to output at the second output signal terminal OUT2.

The first shift register may further include a control output circuit 114. The control output circuit 114 is coupled to the second clock signal terminal CLK2, the pull-up node PU1 and the pull-down node PD1 of the first shift register, and the control output terminal CR. The control output circuit 114 may generate a control output signal based on the signal at the second clock signal terminal CLK2 under the control of the potentials of the pull-up node PU1 and the pull-down node PD1 of the first shift register to output at the control output terminal CR. Since the control output circuit 114 has the same structure and connection relationship as the second output circuit 113, the signal at the control output terminal CR is the same as the signal at the second output signal terminal OUT2, and the signal at the control output terminal CR can be provided to other shift registers unit as input signal or reset signal instead of the second output signal.

The second shift register may include a second control circuit 121 and a third output circuit 122. The second control circuit 121 is coupled to the input signal terminal IN and the reset signal terminal RST. The second control circuit 121 may control the potentials of the pull-up node PU2 and the pull-down node PD2 of the second shift register according to the signals of the input signal terminal IN and the reset signal terminal RST. The third output circuit 122 is coupled to the third clock signal terminal CLK3, the pull-up node PU2 and the pull-down node PD2 of the second shift register, and the output signal terminal OUT3. The third output circuit 122 may generate a third output signal based on the signal at the third clock signal terminal CLK3 under the control of the potentials of the pull-up node PU2 and the pull-down node PD2 of the second shift register to output at the third output signal terminal OUT3.

In FIG. 4, the first control circuit 111 may include a first input sub-circuit, a first control sub-circuit, and a first reset sub-circuit.

The first input sub-circuit includes transistors T9 and T10. The first input sub-circuit may input the signal at the input signal terminal IN to the pull-up node PU1. As shown in FIG. 4, the gate and the first electrode of the transistor T9 are coupled to the input signal terminal IN, and the second electrode of the transistor T9 is coupled to the first electrode of the transistor T10. The gate of the transistor T10 is coupled to the gate of the transistor T9, and the second electrode of the transistor T10 is coupled to the pull-up node PU1.

The first control sub-circuit includes transistors T13, T14, T15, an inverter INT1 and a capacitor C1. The first control sub-circuit can control the potential at the pull-down node PD1 according to the potential at the pull-up node PU1, and pull down the potential at the pull-up node PU1 to the potential at the reference signal terminal vgl1 according to the potential at the pull-down node PD1. As shown in FIG. 4, the gate of the transistor T13 is coupled to the pull-down node PD1, the first electrode of the transistor T13 is coupled to the pull-up node PU1, and the second electrode of the transistor T13 is coupled to the first electrode of the transistor T14. The gate of the transistor T14 is coupled to the pull-down node PD1, the first electrode of the transistor T14 is coupled to the second electrode of the transistor T9 and the first electrode of the transistor T10, and the second electrode of the transistor T14 is coupled to the reference signal terminal vgl1. The gate of the transistor T15 is coupled to the pull-up node PU1, the first electrode of the transistor T15 is coupled to the power supply signal terminal VGH, and the second electrode of the transistor T15 is coupled to the second electrode of the transistor T13 and the first electrode of the transistor T14. The input terminal of the inverter INT1 is coupled to the pull-up node PU1, and the output terminal of the inverter INT1 is coupled to the pull-down node PD1. One end of the capacitor C1 is coupled to the pull-up node PU1, and the other end of the capacitor C1 is coupled to the control output CR.

Those skilled in the art may understand that the reference signal terminal vgl1 may have the same or different potential as the reference signal terminal VGL, as long as the reset reference signal can be provided, which is not limited in the present disclosure.

The first reset sub-circuit includes transistors T11 and T12. The first reset sub-circuit can reset the pull-up node PU1 to the potential of the reference signal terminal vgl1 under the control of the signal at the reset signal terminal RST. As shown in FIG. 4, the gate of the transistor T11 is coupled to the reset signal terminal RST, the first electrode of the transistor T11 is coupled to the pull-up node PU1, and the second electrode of the transistor T11 is coupled to the first electrode of the transistor T12. The gate of the transistor T12 is coupled to the reset signal terminal RST, the first electrode of the transistor T12 is coupled to the second electrode of the transistor T9 and the first electrode of the transistor T10, and the second electrode of the transistor T12 is coupled to the reference signal terminal vgl1. The first control circuit 111 may further include a second reset sub-circuit. In FIG. 4, the second reset sub-circuit includes a transistor T16, the gate of the transistor T16 is coupled to the total reset signal terminal Total_rs, the first electrode of the transistor T16 is coupled to the pull-up node PU1, the second electrode of the transistor T16 is coupled to the reference signal terminal vgl1. The second reset sub-circuit can reset the pull-up node PU1 to the level of the reference signal terminal vgl1 under the control of the signal at the total reset signal terminal Total_rs.

The first output circuit 112 may include a transistor T1 and a transistor T2. The gate of the transistor T1 is coupled to the pull-up node PU1, the first electrode of the transistor T1 is coupled to the first clock signal terminal CLK1, and the second electrode of the transistor T1 is coupled to the first output signal terminal OUT1. The gate of the transistor T2 is coupled to the pull-down node PD1, the first electrode of the transistor T2 is coupled to the reference signal terminal VGL, and the second electrode of the transistor T2 is coupled to the first output signal terminal OUT1.

The second output circuit 113 includes a transistor T3 and a transistor T4. The gate of the transistor T3 is coupled to the pull-up node PU1, the first electrode of the transistor T3 is coupled to the second clock signal terminal CLK2, and the second electrode of the transistor T3 is coupled to the second output signal terminal OUT2. The gate of the transistor T4 is coupled to the pull-down node PD1, the first electrode of the transistor T4 is coupled to the reference signal terminal VGL, and the second electrode of the transistor T4 is coupled to the second output signal terminal OUT2.

The third output circuit 122 includes a transistor T5 and a transistor T6. The gate of the transistor T5 is coupled to the pull-up node PU2 of the second shift register, the first electrode of the transistor T5 is coupled to the third clock signal terminal CLK3, and the second electrode of the transistor T5 is coupled to the third output signal terminal OUT3. The gate of the transistor T6 is coupled to the pull-down node PD2 of the second shift register, the first electrode of the transistor T6 is coupled to the reference signal terminal VGL, and the second electrode of the transistor T6 is coupled to the third output signal terminal OUT3.

The second control circuit 121 may include a transistor T17, a transistor T18, a transistor T19, a transistor T20, a transistor T21, a transistor T22, a transistor T23, and a transistor T24. A person skilled in the art may understand that the second control circuit 121 in FIG. 4 has the same structure and connection relationship as the first control circuit 111, and the transistors T17 to T24 in the second control circuit 121 may be coupled in a similar manner to the transistors T9 to T16 in the first control circuit 111, respectively. For brevity, they are not described in detail here.

Figure 5:
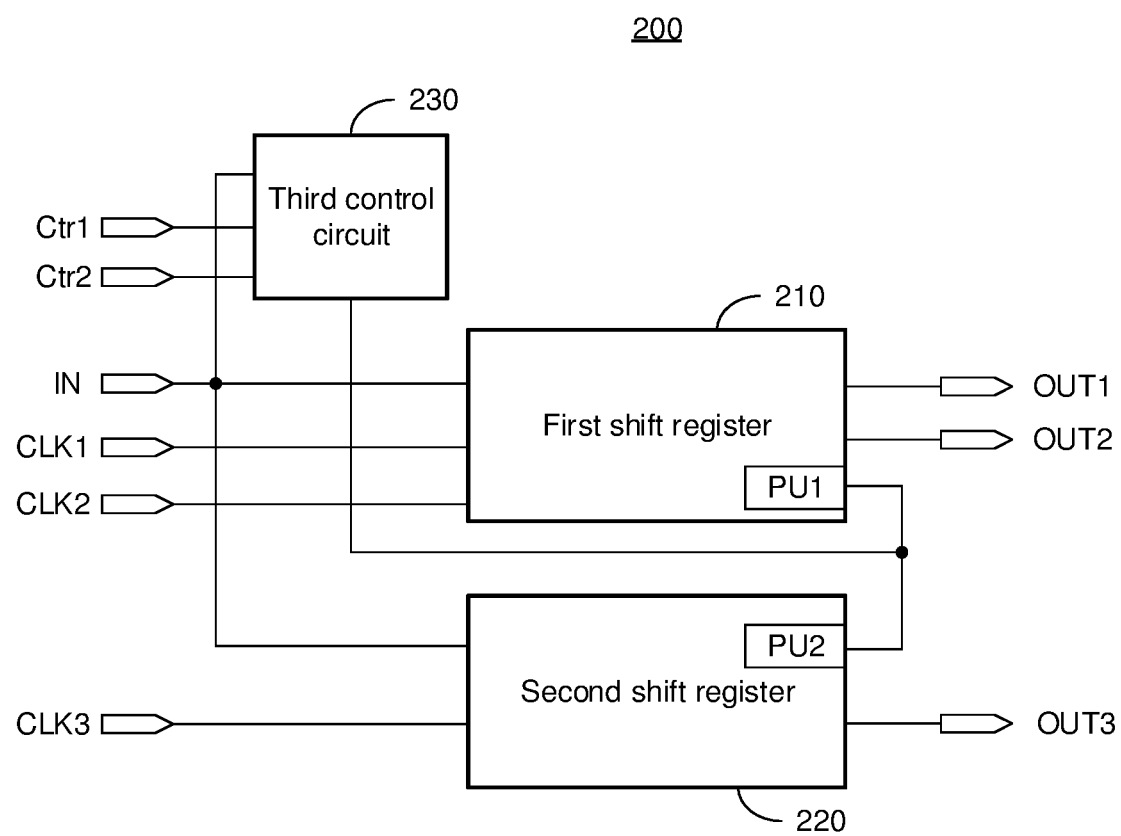
FIG. 5 shows a schematic block diagram of a shift register unit according to another embodiment of the present disclosure.

FIG. 5 shows a schematic block diagram of a shift register unit according to another embodiment of the present disclosure. The shift register unit 200 of FIG. 5 is similar to the shift register unit 100 of FIG. 3, except that the shift register unit 200 further includes a third control circuit 230. For the sake of brevity, the differences are mainly described in detail below.

As shown in FIG. 5, the shift register unit 200 may include a first shift register 210, a second shift register 220 and a third control circuit 230. The first shift register 210 and the second shift register 220 may be implemented by the first shift register 110 and the second shift register 120 described above with reference to FIG. 3, respectively. The third control circuit 230 is coupled to the first control signal terminal Ctr1, the second control signal terminal Ctr2, and the input signal terminal IN. The third control circuit 230 may control the potentials of the pull-up nodes PU1 and PU2 under the control of the signals of the input signal terminal IN, the first control signal terminal Ctr1 and the second control signal terminal Ctr2. For example, in the display phase, when the second control signal terminal Ctr2 and the input signal terminal IN are at the first level at the same time, the third control circuit 230 may store the voltage. In the blanking phase, the third control circuit 230 may use the stored voltage and the signal at the second control signal terminal Ctr2 to control the potentials of the pull-up nodes PU1 and PU2, so that the shift register unit 200 generates a first output signal, a second output signal, and a third output signal as sensing control signals.

Figure 6:
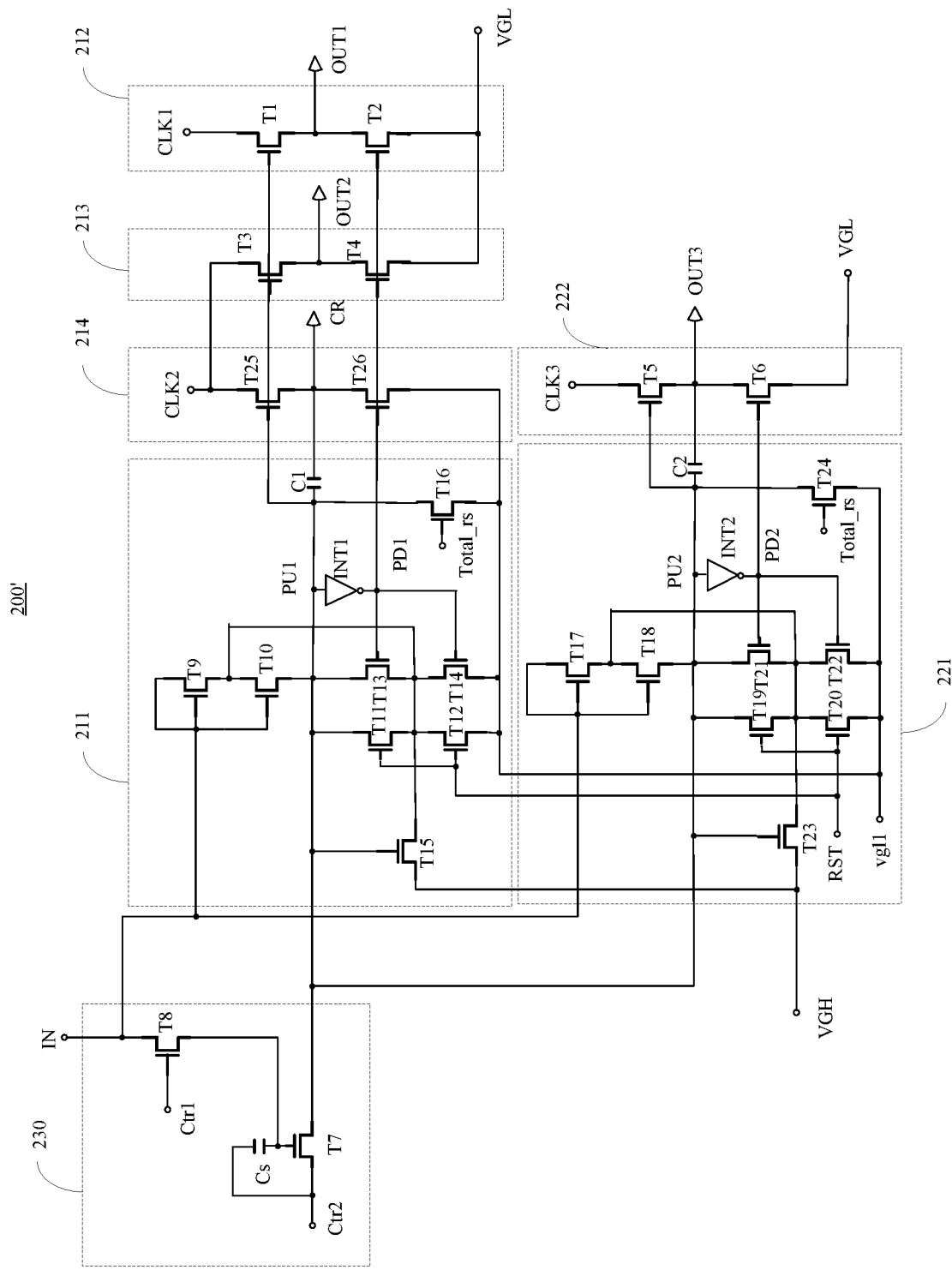
FIG. 6 shows an example circuit diagram of a shift register unit of FIG. 5.

FIG. 6 shows an example circuit diagram of the shift register unit of FIG. 5. As shown in FIG. 6, the shift register unit 200' includes a first shift register, a second shift register, and a third control circuit 230.

The first shift register may include a first control circuit 211, a first output circuit 212, a second output circuit 213, and a control output circuit 214. The first control circuit 211, the first output circuit 212, the second output circuit 213, and the control output circuit 214 may have the same structure as the first control circuit 111, the first output circuit 112, the second output circuit 113, and the control output circuit 114 described above with reference to FIG. 4, respectively.

The second shift register may include a second control circuit 221 and a third output circuit 222. The second control circuit 221 and the third output circuit 222 may have the same structure as the second control circuit 121 and the third output circuit 122 described above with reference to FIG. 4, respectively.

The third control circuit 230 includes transistors T7 and T8 and a capacitor Cs. The gate of the transistor T7 is coupled to the first end of the capacitor Cs, the first electrode of the transistor T7 is coupled to the second control signal terminal Ctr2 and the second end of the capacitor Cs, and the second electrode of the transistor T7 is coupled to the pull-up nodes PU1 and PU2. The gate of the transistor T8 is coupled to the first control signal terminal Ctr1, the first electrode of the transistor T8 is coupled to the input signal terminal IN, and the second electrode of the transistor T8 is coupled to the gate of the transistor T7.

Figure 7:
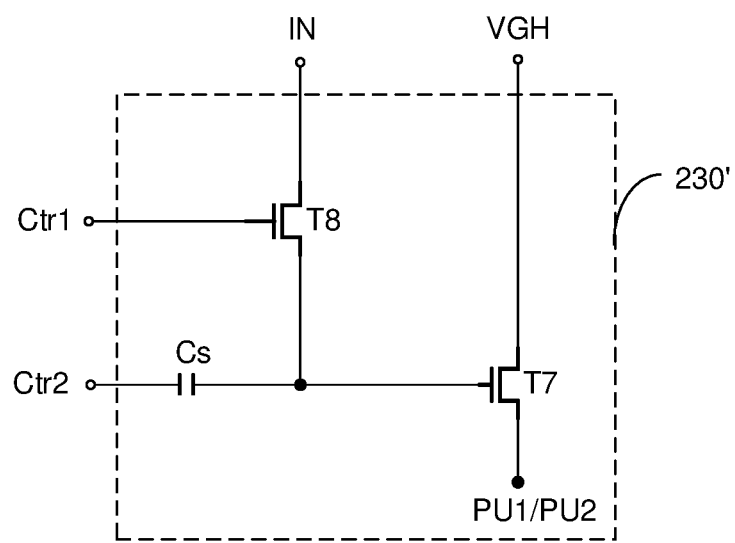
FIG. 7 shows another example of a third control circuit of a shift register unit according to an embodiment of the present disclosure.

FIG. 7 shows another example of a third control circuit of a shift register unit according to an embodiment of the present disclosure. As shown in FIG. 7, the third control circuit 230' includes a transistor T7 and a transistor T8 and a capacitor Cs.

The first end of the capacitor Cs is coupled to the second control signal terminal Ctr2, and the second end is coupled to the gate of the transistor T7. The first electrode of the transistor T7 is coupled to the power signal terminal VGH, and the second electrode of the transistor T7 is coupled to the pull-up nodes PU1 and PU2. The gate of the transistor T8 is coupled to the first control signal terminal Ctrl, the first electrode of the transistor T8 is coupled to the input signal terminal IN, and the second electrode of the transistor T8 is coupled to the gate of the transistor T7.

The gate driving circuit according to the embodiment of the present disclosure will be described below with reference to FIG. 8.

Figure 8:
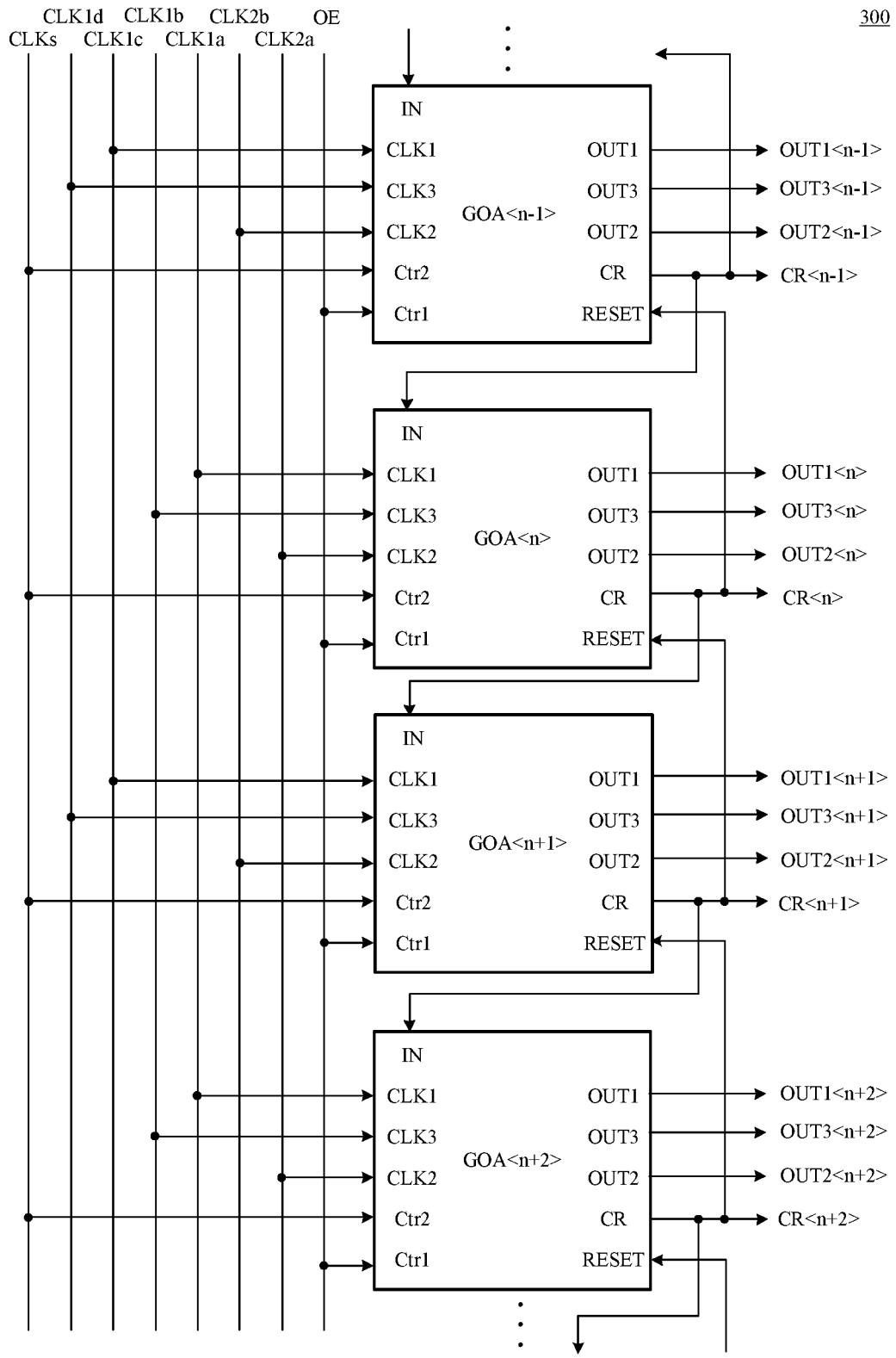
FIG. 8 shows a schematic block diagram of a gate driving circuit according to an embodiment of the present disclosure.

FIG. 8 shows a schematic block diagram of a gate driving circuit according to an embodiment of the present disclosure. As shown in FIG. 8, the gate driving circuit 300 includes N stages of cascaded shift register units. For simplicity, FIG. 8 shows only the $(n-1)^{th}$ stage of shift register unit GOA<n-1>, $n^{th}$ stage of shift register unit GOA<n>, $(n+1)^{th}$ stage of shift register unit GOA<n+1> and $(n+2)^{th}$ stage of shift register unit GOA<n+2>, where n and N are integers, N≥4, and 2≤n≤N-1. The input signal terminal IN of the $n^{th}$ stage of shift register unit GOA<n> is coupled to the second output signal terminal of the $(n-1)^{th}$ stage of shift register unit GOA<n-1> (for example, in FIG. 8, it is coupled to the control output terminal CR<n-1>), the reset signal terminal RST of the $n^{th}$ stage of shift register unit GOA<n> is coupled to the second output signal terminal of the $(n+1)^{th}$ stage of shift register unit GOA<n+1> (for example, in FIG. 8, it is coupled to the control output terminal CR<n+1>).

The N stages of cascaded shift register unit may include multiple groups of shift register units, and each group of shift register units includes a cascaded first shift register unit, second shift register unit, third shift register unit and four shift register units. The first shift register unit, the second shift register unit, the third shift register unit and the four shift register units are shown in FIG. 8 as shift register units GOA<n-1>, GOA<n>, GOA<n+1>, and GOA<n+2>, respectively. The first clock signal terminal CLK1 of the second shift register unit GOA<n> and the first clock signal terminal CLK1 of the fourth shift register unit GOA<n+2> are coupled to receive the first clock signal CLK1a, and the second clock signal terminal CLK2 of the second shift register unit GOA<n> and the second clock signal terminal CLK2 of the fourth shift register unit GOA<n+2> are coupled to receive the second clock signal CLK2a, and the third clock signal terminal CLK3 of the second shift register unit GOA<n> and the third clock signal terminal CLK3 of the fourth shift register unit GOA<n+2> are coupled to receive the third clock signal CLK1b. The first clock signal terminal CLK1 of the first shift register unit GOA<n-1> and the first clock signal terminal CLK1 of the third shift register unit GOA<n+1> are coupled to receive the fourth clock signal CLK1c, and the second clock signal terminal CLK2 of the first shift register unit GOA<n-1> and the second clock signal terminal CLK2 of the third shift register unit GOA<n+1> are coupled to receive the fifth clock signal CLK2b, and the third clock signal terminal CLK3 of the first shift register unit GOA<n-1> and the third clock signal terminal CLK3 of the third shift register unit GOA<n+1> are coupled to receive the sixth clock signal CLK1d.

In the case where the shift register unit has a third control circuit, such as the structure described above with reference to FIGS. 5 to 7, each shift register unit also has a first control signal terminal Ctr1 and a second control signal terminal Ctr2, wherein the first control signal terminal Ctr1 is coupled to receive the first control signal OE, and the second control signal terminal Ctr2 is coupled to receive the second control signal CLKs.

An embodiment of the present disclosure also provides a display apparatus including the above-mentioned gate driving circuit. The display apparatus according to the embodiment of the present disclosure will be described below with reference to FIG. 9 in conjunction with FIG. 8.

Figure 9:
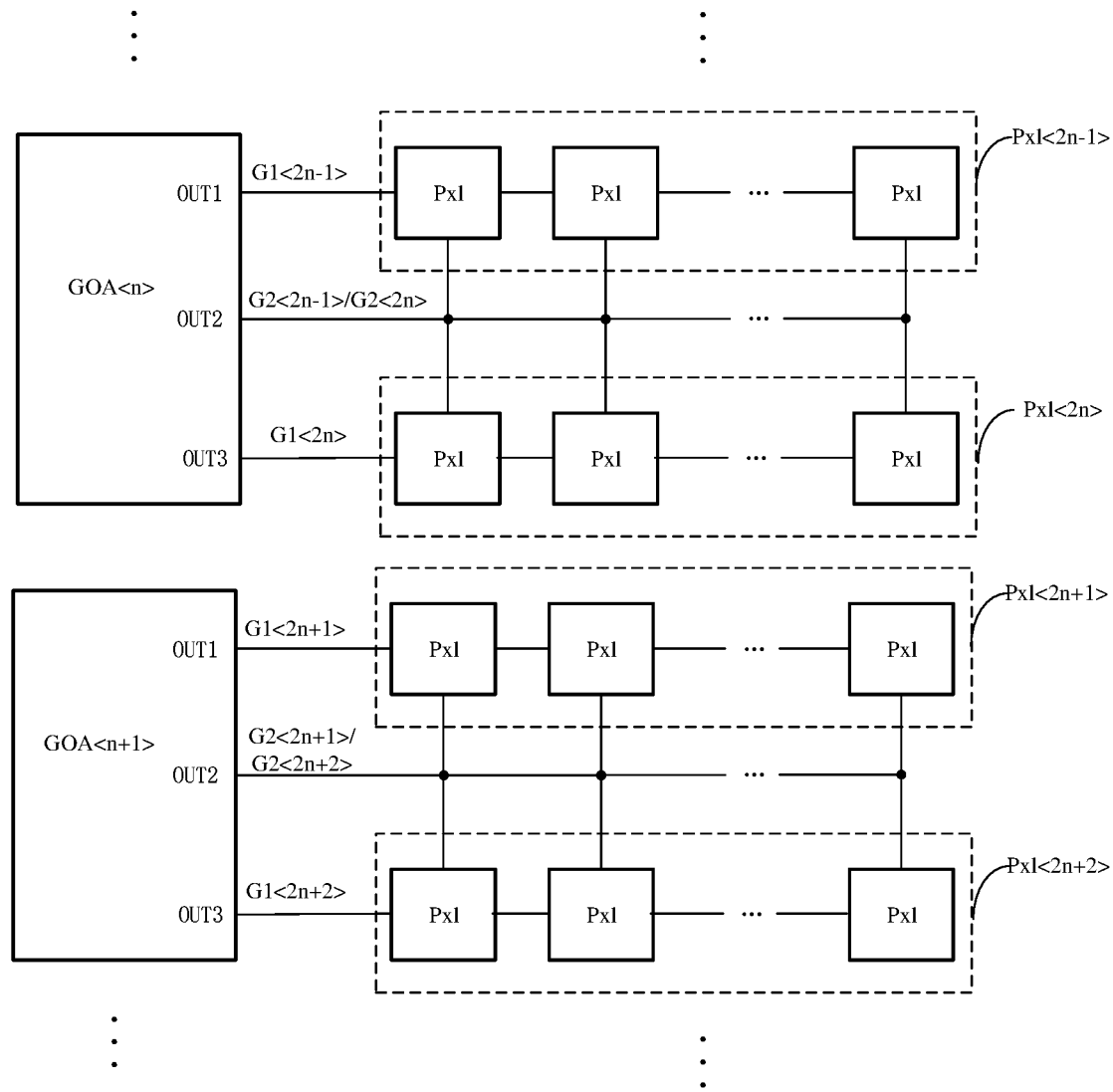
FIG. 9 shows a schematic block diagram of a display apparatus according to an embodiment of the present disclosure.

FIG. 9 shows a schematic block diagram of a display apparatus according to an embodiment of the present disclosure.

As shown in FIG. 9, the display apparatus 400 may include a gate driving circuit and a plurality of pixel units Pxl arranged in multiple rows. The gate driving circuit may have the structure described above with reference to FIG. 8, for example, including N stages of cascaded shift register units. Correspondingly, the plurality of pixel units Pxl are arranged in 2N rows, and each pixel unit has a first control terminal and a second control terminal. For example, the structure described above with reference to FIG. 1 may be adopted. For simplicity, only two rows of shift register units (the $n^{th}$ row of shift register unit GOA<n> and the $(n+1)^{th}$ row of shift register unit GOA<n+1>) and their corresponding rows of pixel unit are shown in FIG. 9.

As shown in FIG. 9, the $n^{th}$ stage of the shift register unit GOA<n> is coupled to the $(2n-1)^{th}$ row of the pixel unit Pxl<2n-1> and the $2n^{th}$ row of the pixel unit Pxl<2n>. The first output signal terminal OUT1 of the $n^{th}$ stage of the shift register unit GOA<n> is coupled to the first control terminal G1<2n-1> of the $(2n-1)^{th}$ row of the pixel unit Pxl<2n-1>, and the second output signal terminal OUT2 of the $n^{th}$ stage of the shift register unit is coupled to the second control terminal G2<2n-1> of the $(2n-1)^{th}$ row of the pixel unit Pxl<2n-> and the second control terminal G2<2n> of the $2n^{th}$ row of the pixel unit Pxl<2n>, the third output signal OUT3 terminal of the $n^{th}$ stage of the shift register unit GOA<n> is coupled to the first control terminal G1<2n> of the $2n^{th}$ row of the pixel unit Pxl<2n>. It can be seen that the second output signal provided by the shift register unit GOA<n> at the second output signal terminal OUT2 is shared by the second control terminals G2 of the two rows of pixel units Pxl<2n−1> and Pxl<2n>. The shift register unit GOA<n+1> adopts a similar connection manner, and so on, so that a shift register unit controls two rows of pixel units.

The method of controlling the shift register unit according to an embodiment of the present disclosure will be described below with reference to FIGS. 10 to 12.

Figure 10:
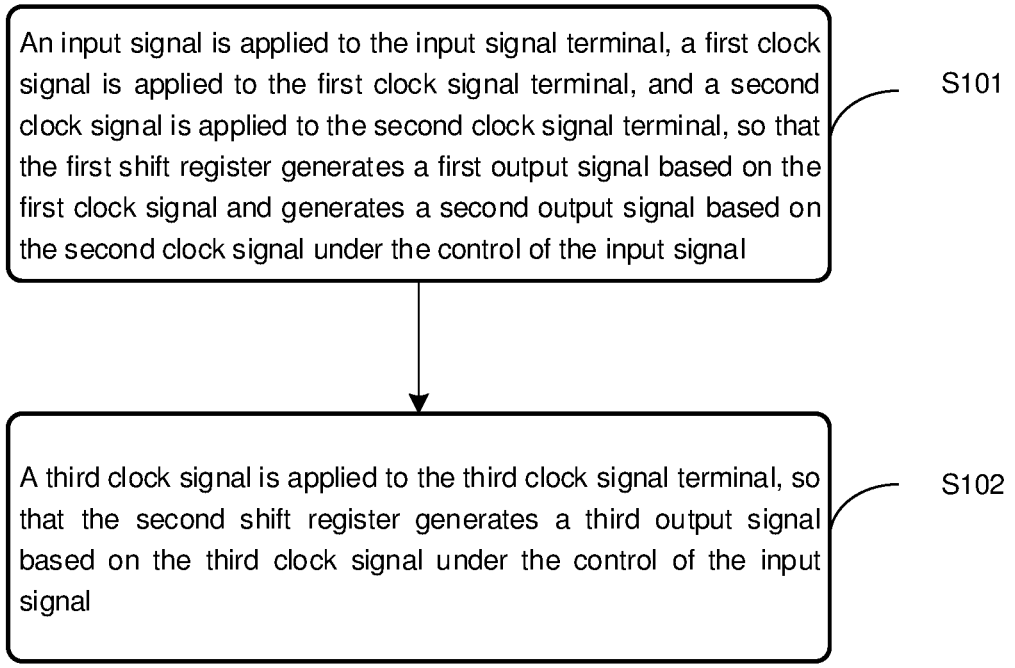
FIG. 10 shows a flowchart of a method of controlling a shift register unit according to an embodiment of the present disclosure.

FIG. 10 shows a flowchart of a method of controlling a shift register unit according to an embodiment of the present disclosure. This control method can be applied to the shift register unit described above.

In step S101, an input signal is applied to the input signal terminal IN of the shift register unit, a first clock signal is applied to the first clock signal terminal CLK1, and a second clock signal is applied to the second clock signal terminal CLK2. The first shift register generates a first output signal based on the first clock signal and generates a second output signal based on the second clock signal under the control of the input signal In step S102, a third clock signal is applied to the third clock signal terminal CLK3, and the second shift register generates a third output signal based on the third clock signal under the control of the input signal.

Although the method steps are described above in a specific order, the embodiments of the present disclosure are not limited to this, and the above steps may be performed in different orders or simultaneously as needed.

Figure 11:
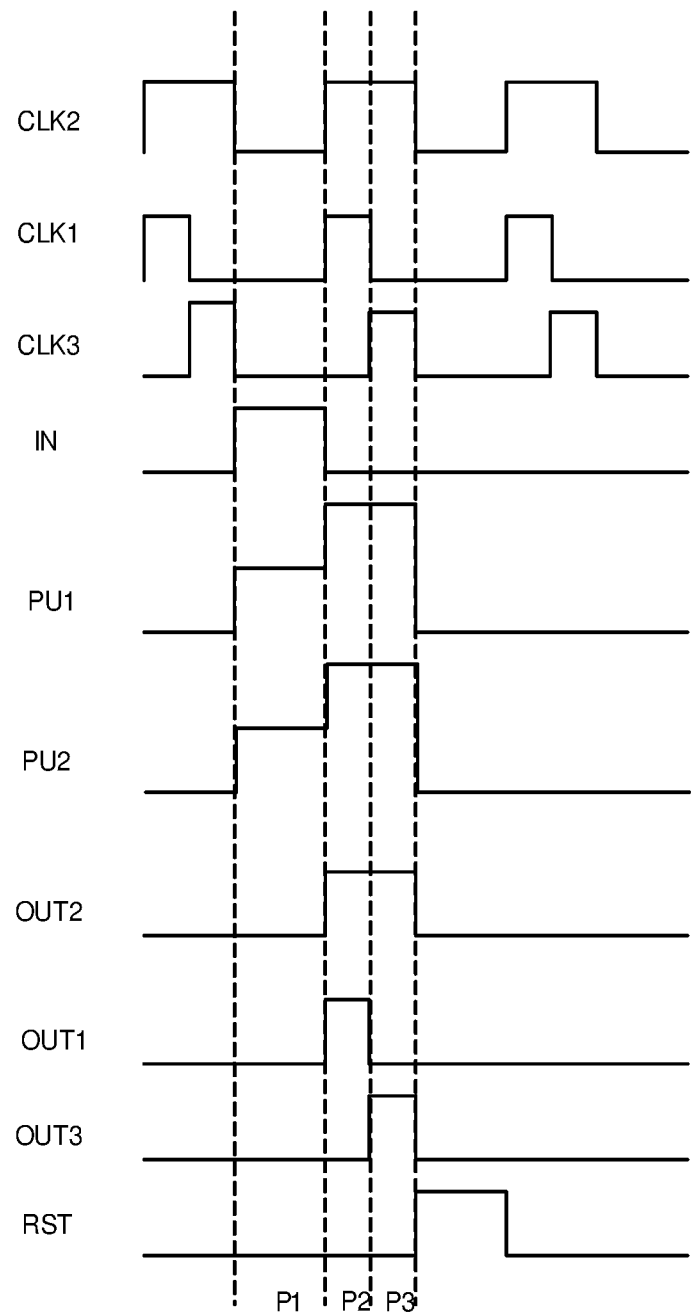
FIG. 11 shows a signal timing diagram of a shift register unit according to an embodiment of the present disclosure.

FIG. 11 shows a signal timing diagram of a shift register unit according to an embodiment of the present disclosure, specifically showing the basic signal timing of the shift register unit at the display phase. This signal timing can be applied to the shift register unit described above.

As shown in FIG. 11, in the display phase, the first clock signal at the first clock signal terminal CLK1, the second clock signal at the second clock signal terminal CLK2, and the third clock signal at the third clock signal terminal CLK3 are pulse signals having the same period. The pulse width of the first clock signal at the first clock signal terminal CLK1 and the third clock signal at the third clock signal terminal CLK3 is half of the pulse width of the second clock signal at the second clock signal terminal CLK2, such that the second output signal at the second output signal terminal OUT2 coincides with the superposition of the first output signal at the first output signal terminal OUT1 and the third output signal at the third output signal terminal OUT3. As shown in FIG. 11, those skilled in the art can understand that, according to an embodiment of the present disclosure, "the second output signal coincides with the superposition of the first output signal and the third output signal" can be understood that the pulse width of the second output signal is equal to the sum of the pulse widths of the first output signal and the third output signal, and the signal edge of the second output signal coincides with the superimposed signal edge of the first output signal and the third output signal. For example, as shown in FIG. 11, the rising edge of the second output signal coincides with the rising edge of the first output signal, and the falling edge of the second output signal coincides with the falling edge of the third output signal.

Next, the signal timing of FIG. 11 will be described in detail in conjunction with the shift register unit 100' shown in FIG. 4.

In the first period P1, the input signal at the input signal terminal IN of the shift register unit 100' is at a first level to pull up the potentials of the pull-up nodes PU1 and PU2 to the first potential. In the following example, the "first level" is a relatively high level (for example, 24V) and the "second level" is a relatively low level (for example, −6V).

Referring to FIG. 4, the input signal terminal IN is at a high level, the transistors T9 and T10 are turned on, the pull-up node PU1 is pulled up to a high level, and the capacitor C1 starts charging. Since the pull-up node PU2 is coupled to the pull-up node PU1, the pull-up node PU2 is also pulled up to a high level, thereby charging the capacitor C2. The pull-up node PU1 is at a high level to turn on the transistors T1, T3, and T25. Since the first clock signal terminal CLK1 and the second clock signal terminal CLK2 are both at a low level at this time, the first output signal terminal OUT1, the second output signal terminal OUT2 and the control output terminal CR are both at a low level. Similarly, the pull-up node PU2 is at a high level to turn on the transistor T5, and since the third clock signal terminal CLK3 is at a low level, the third output signal terminal OUT3 is at a low level. Due to the presence of the inverter INT1, the high level of the pull-up node PU1 makes the pull-down node PD1 to be at a low level. Similarly, the presence of the inverter INT2 makes the pull-down node PD2 also to be at a low level during this period. In addition, the high level of the pull-up node PU1 causes the transistor T15 to be turned on, thereby inputting the high level of the power supply signal terminal VGH to the node between the transistors T9 and T10, the node between the transistors T11 and T12, and the node between the transistors T13 and T14 to stabilize the potential at the pull-up node PU1.

In the second period P2, the first clock signal at the first clock signal terminal CLK1 and the second clock signal at the second clock signal terminal CLK2 are at the first level, and the potential at the pull-up node PU1 makes the first shift register output the first output signal at the first level at the first output signal terminal OUT1, and output the second output signal at the first level at the second output signal terminal OUT2.

Referring to FIG. 4, in the second period P2, the input signal terminal IN is at a low level, the transistors T9 and T10 are turned off, the capacitor C1 may keep the pull-up node PU1 high, and the transistors T1, T3, and T25 continue to conduct. Since the first clock signal terminal CLK1 and the second clock signal terminal CLK2 are at a high level at this time, the first output signal terminal OUT1, the second output signal terminal OUT2 and the control output terminal CR are written into high level. Due to the bootstrap effect of the capacitor C1, the potential at the pull-up node PU1 is further increased. For the second shift register, the high level of the pull-up node PU2 turns on the transistor T5. Since the third clock signal terminal CLK3 is at a low level, the third output signal terminal OUT3 is still at a low level.

In the third period P3, the second clock signal at the second clock signal terminal CLK2 maintains at the first level, the first clock signal at the first clock signal terminal CLK1 changes from being at the first level to being at the second level, and the third clock signal at the third clock signal terminal CLK3 is at the first level. The potential at the pull-up node PU1 causes the first shift register to output the second output signal at the first level at the second output signal terminal OUT2 and output the first output signal at the second level at the first output signal terminal OUT1, and the potential at the pull-up node PU2 causes the second shift register to output the third output signal at the first level at the third output signal terminal OUT3.

Referring to FIG. 4, in the third period P3, the presence of the capacitor C1 keeps the pull-up node PU1 high, the transistors T1, T3, and T25 continue to conduct, and the high level of the second clock signal terminal CLK2 makes the second output signal terminal OUT2 and the control output terminal CR continue to be at a high level, and the first clock signal terminal CLK1 is at a low level so that the first output signal terminal OUT1 is also at a low level. The high level of the pull-up node PU2 causes the transistor T5 to continue to conduct. At this time, since the third clock signal terminal CLK3 is at a high level, the third output signal terminal OUT3 is also at a high level.

Thereafter, as shown in FIG. 11, the reset signal terminal RST is at a high level, the transistors T11 and T12 are turned on, thereby pulling down the pull-up node PU1 to the low level of the reference signal terminal vgl1, and the inverter INT1 causes the pull-down node PD1 to be at a high level, so that the transistors T13, T14, T26, T4, and T2 are turned on, pulling down the pull-up node PU1, the control output terminal CR, the second output signal terminal OUT2, and the first output signal terminal T1 to the low level of the reference signal terminal vgl1.

The above describes the basic signal timing of the shift register unit in the display phase. For the case involving sensing control, for example, in the case where the shift register unit further includes a third control circuit, the signal timing is also involved the blanking phase in addition to the display phase. For example, a first control signal may be applied to the first control signal terminal Ctr1, and a second control signal may be applied to the second control signal terminal Ctr2, so that in response to the input signal at the input signal terminal IN and the second control signal at the second control signal terminal Ctr2 of the shift register unit being at the first level at the same time, the shift register unit is controlled to generate a first output signal, a second output signal, and a third output signal as sensing control signals during the blanking phase.

This case will be described in detail below with reference to FIG. 12.

Figure 12:
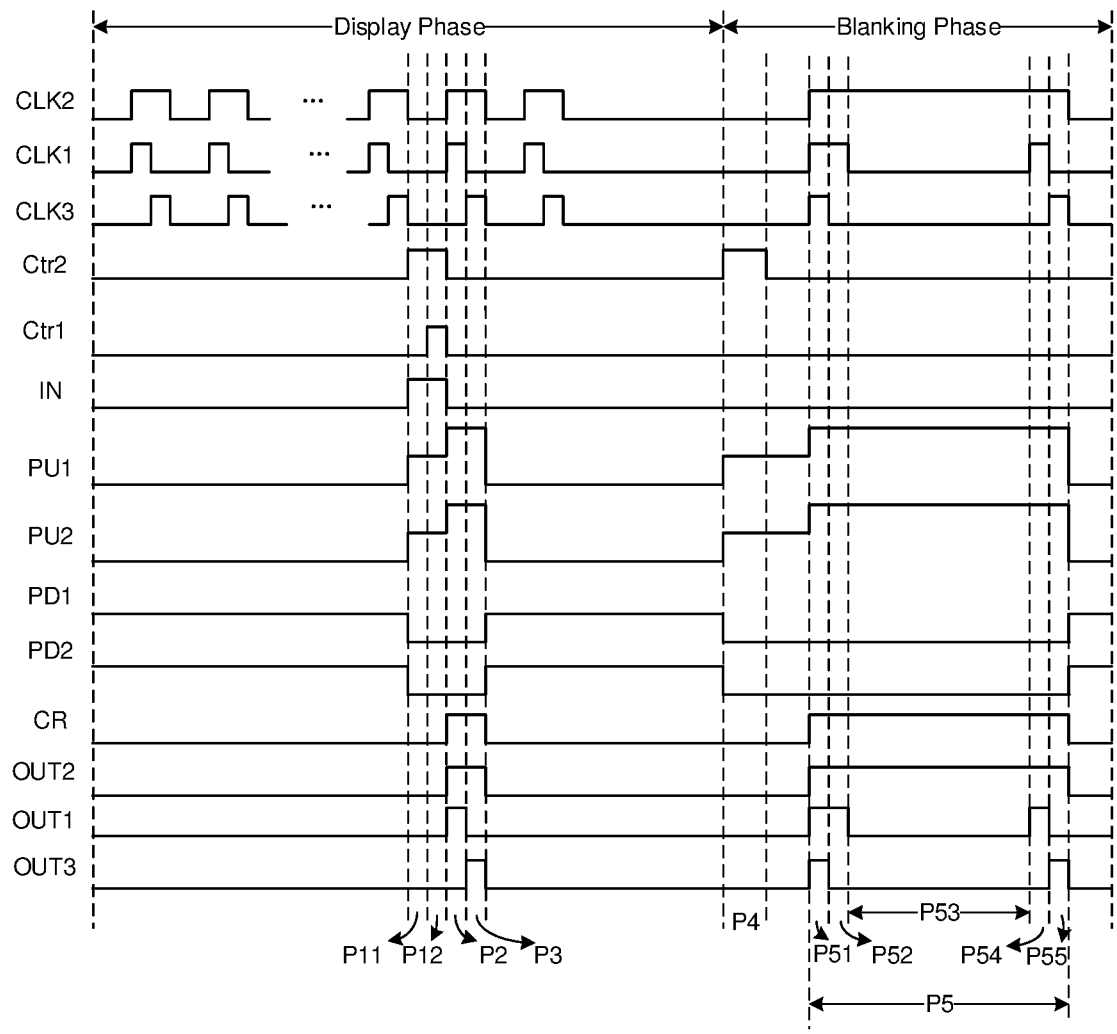
FIG. 12 shows a signal timing diagram of a shift register unit according to another embodiment of the present disclosure.

FIG. 12 shows a signal timing diagram of a shift register unit according to another embodiment of the present disclosure. This signal timing can be applied to the shift register unit having the third control circuit described above with reference to FIGS. 5 to 7. In this embodiment, the low level of the first control signal is lower than the low levels of the input signal and the second control signal. For example, the low level of the first control signal may be referred to as a "third level". For example, the high level of the first control signal is 24V and the low level is −24V; the high level of other signals in FIG. 12 is 24v and the low level is −6V. The reason is that if the shift register unit at this phase is not selected (i.e., when there is no second control signal having a high level occurring simultaneously with a high level at the input signal terminal of the shift register unit during the display phase), by setting the low level of the first control signal to −24V (instead of −6V), the gate of the transistor T7 can be kept at a low potential (for example, about −20V) during the blanking phase, so that no sensing control signal is generated. This will be explained in detail in the description with reference to FIG. 14 below.

As shown in FIG. 12, a frame display may include a display phase and a blanking phase.

In the display phase, the signals of the respective signal terminals of the first shift register and the second shift register are the same as those in FIG. 11, and the difference is at least the signal at the first control signal terminal Ctr1 and the signal at the second control signal terminal Ctr2. As shown in FIG. 12, in the first period, the input signal at the input signal terminal IN and the second control signal at the second control signal terminal Ctr2 are both at a high level, and in at least a part of the first period, the first control signal at the first control signal terminal Ctr1 is at a high level. For example, the first period P1 may include a first sub-period P11 and a second sub-period P12, in which the first control signal at the first control signal terminal Ctr1 is at a high level (for example, 24V). Of course, the first control signal at the first control signal terminal Ctr1 may also be at a high level throughout the first period P1. In some embodiments, the falling edge of the first control signal at the first control signal terminal Ctr1 may be before the falling edge of the second control signal at the second control signal terminal Ctr2. The purpose is to turn off the transistor T8 before the second control signal terminal Ctr2 changes from being at a high level to being at a low level. Therefore, the capacitor Cs makes the potential of the gate of the transistor T7 follow the potential at the second control signal terminal Ctr2. Taking the shift register unit of FIG. 6 as an example, during the second sub-period P12 of the display phase, the high level of the first control signal terminal Ctr1 causes the high level (for example, 24V) of the input signal terminal IN to be transferred to the first end of the capacitor Cs, the high level (for example, also 24V) of the second control signal terminal Ctr2 is provided to the second end of the capacitor Cs. The capacitor Cs can store the voltage across it (for example, 0V), and then the gate of the transistor T7 follows the potential at the second control signal terminal Ctr2, and this voltage can be used in the subsequent blanking phase. The high level of the first control signal terminal Ctr1 turns on the transistor T8, the high level (for example, 24V) of the input signal terminal IN is written into the gate of the transistor T7 through the transistor T8, so that the transistor T7 is turned on, and the high level of the second control signal terminal Ctr2 is written into the pull-up node PU1. After the end of the first period, the second control signal terminal Ctr2 changes from being at a high level to being at a low level, and the presence of the capacitor Cs causes the gate of the transistor T7 to change from being at a high level (for example, 24V) to being at a low level (for example, −6V).

In the blanking phase, the first control signal at the first control signal terminal Ctr1 is at a low level. The blanking period includes a fourth period P4 and a fifth period P5.

In the fourth period P4, the second control signal at the second control signal terminal Ctr2 is at a high level, so that the third control circuit pulls up the potentials of the pull-up nodes of the first shift register and the second shift register to the first Potential. Also taking the shift register unit of FIG. 6 as an example, the fourth period P4 is also referred to as the start pulse generation phase, the second control signal terminal Ctr2 is at a high level (for example, 24V), and the presence of the capacitor Cs makes the gate of the transistor T7 also to be at a high level(for example, 24V). The transistor T7 is turned on, so that the high level of the second control signal terminal Ctr2 is written into the pull-up nodes PU1 and PU2 to charge the capacitors C1 and C2 for the subsequent writing of a clock signal to the output signal terminal in the fifth period P5.

In the fifth period P5, the potentials of the pull-up nodes PU1 and PU2 cause the shift register unit to generate the first output signal, the second output signal and the third output signal according to the signals of the first clock signal terminal CLK1, the second clock signal terminal CLK2, and the third clock signal terminal CLK3, respectively. For example, also taking the shift register unit of FIG. 6 as an example, the presence of the capacitors C1 and C2 keeps the pull-up nodes PU1 and PU2 to be at a high level after the fourth period P4, so that when the subsequent high level of the clock signal arrives in the fifth period P5, the high level of the clock signal is outputted through the corresponding output signal terminal. For example, when the second clock signal terminal CLK2 is at a high level, the transistor T3 is turned on, so that the high level of the second clock signal terminal CLK2 is written into the second output signal terminal OUT2, which will not be repeated here.

The signals of the first clock signal terminal CLK1, the second clock signal terminal CLK2, and the third clock signal terminal CLK3 may be set as shown in FIG. 12. For example, the fifth period P5 includes a first sub-period P51, a second sub-period P52, a third sub-period P53, a fourth sub-period P54, and a fifth sub-period P55. The second clock signal at the second clock signal terminal CLK2 is at a high level throughout the fifth period P5, and the first clock signal at the first clock signal terminal CLK1 is at a high level in the first sub-period P51, second sub-period P52 and fourth sub-period P54, and the third clock signal at the third clock signal terminal CLK3 is at a high level in the first sub-period P51 and the fifth sub-period P55, which makes the shift register unit output a high level of the second output signal at the second output signal terminal OUT2 throughout the fifth period P5, and output a high level of the first output signal at the first output signal terminal OUT1 in the beginning phase of the fifth period and in the first half of the ending phase of the fifth period, and output a high level of the third output signal at the third output signal terminal OUT3 in the first half of the beginning phase of the fifth period and in the second half of the ending phase of the fifth period. In the blanking phase, the first output signal, the second output signal, and the third output signal generated by the shift register unit are used to drive the corresponding pixel unit, and the voltage of the node S of the driven pixel unit can be sensed to compensate threshold voltage.

The duration of the fourth period P4 may be greater than the duration of the first period P1, for example, as shown in FIG. 12. This is because the blanking phase can provide more abundant available time than the display phase, so that the second control signal at the second control signal terminal Ctr2 can be maintained at a high level for a relatively long time, thereby making the output more stable.

The method of controlling the gate driving circuit according to the embodiment of the present disclosure will be described below with reference to FIGS. 13 to 15.

Figure 13:
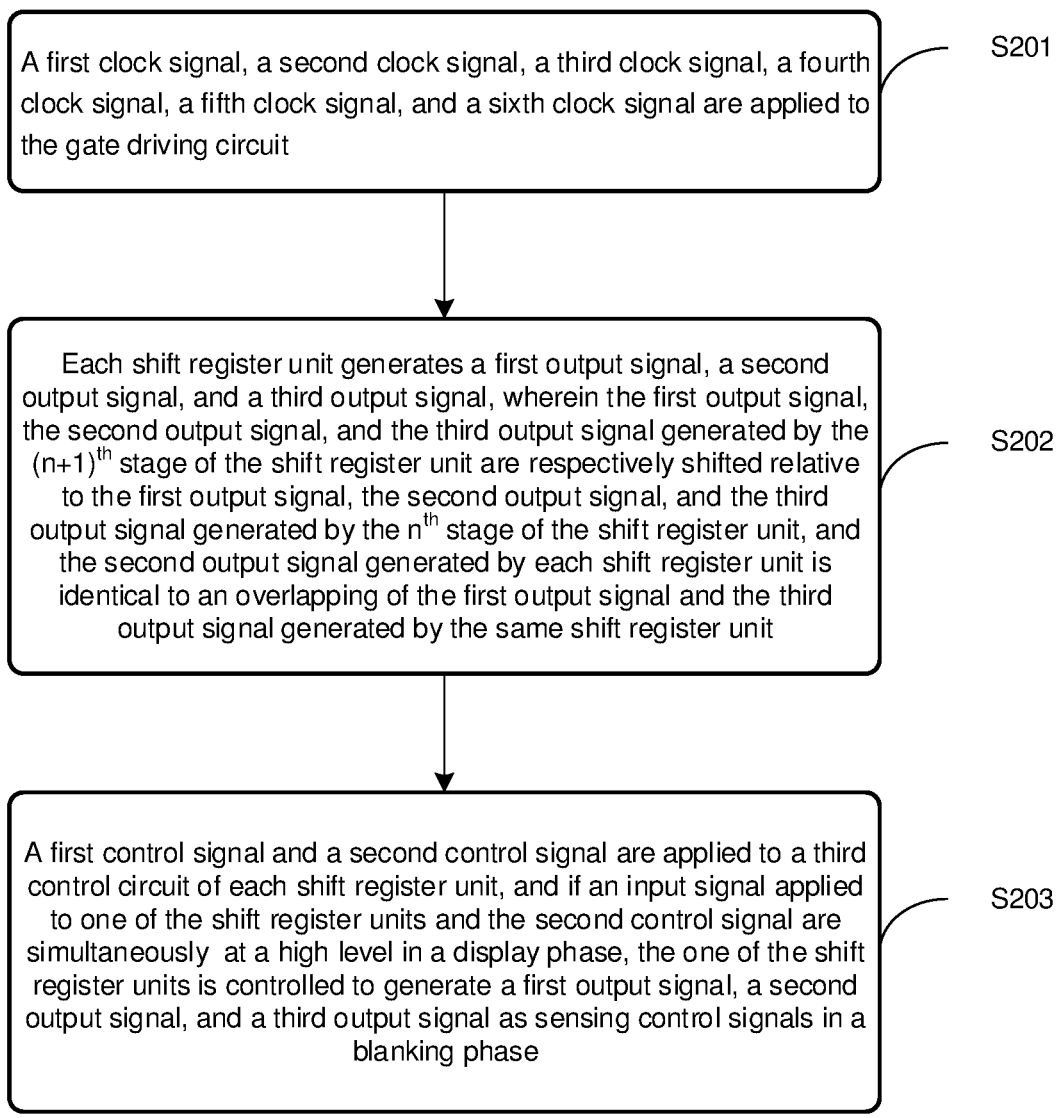
FIG. 13 shows a flowchart of a method of controlling a gate driving circuit according to an embodiment of the present disclosure.

FIG. 13 shows a flowchart of a method of controlling a gate driving circuit according to an embodiment of the present disclosure. This control method can be applied to the gate driving circuit described above, for example, the gate driving circuit 300 described above with reference to FIG. 8.

In step S201, a first clock signal CLK1$a$, a second clock signal CLK2$a$, a third clock signal CLK1$b$, a fourth clock signal CLK1$c$, a fifth clock signal CLK2$b$, and a sixth clock signal CLK1$d$ are applied to the gate driving circuit.

For example, a first clock signal CLK1$a$ may be applied to the first clock signal terminal CLK1 of the second shift register unit GOA<n> and a fourth shift register unit GOA<n+2>, and a second clock signal CLK2$a$ may be applied to the second clock signal terminal CLK2 of the second shift register unit GOA<n> and a fourth shift register unit GOA<n+2>, and a third clock signal CLK1$b$ may be applied to the third clock signal terminal CLK3 of the second shift register unit GOA<n> and a fourth shift register unit GOA<n+2>. A fourth clock signal CLK1$c$ may applied to the first clock signal terminal CLK1 of the first shift register unit GOA<n−1> and the third shift register unit GOA<n+1>, and a fifth clock signal CLK2$b$ may be applied to the second clock signal terminal CLK2 of the first shift register unit GOA<n−1> and the third shift register unit GOA<n+1>, and a sixth clock signal CLK1$d$ may be applied to the third clock signal terminal CLK3 of the first shift register unit GOA<n−1> and the third shift register unit GOA<n+1>.

In step S202, each shift register unit generates a first output signal, a second output signal, and a third output signal, wherein the first output signal, the second output signal, and the third output signal generated by the $(n+1)^{th}$ stage of the shift register unit are respectively shifted relative to the first output signal, the second output signal, and the third output signal generated by the $n^{th}$ stage of the shift register unit, and the second output signal generated by each shift register unit coincides with the superposition of the first output signal and the third output signal generated by the same shift register unit.

For example, the shift register unit GOA<n> outputs the first output signal OUT1<n>, the second output signal OUT2<n>, and the third output signal OUT3<n>. The second output signal OUT2<n> coincides with an overlapping of the first output signal OUT1<n> and the third output signal OUT3<n>.

Due to the cascaded connection, the first output signal OUT1<n+1>, the second output signal OUT2<n+1> and the third output signal OUT3<n+1> generated by the $(n+1)^{th}$ stage of the shift register unit GOA<n+1> are respectively shifted relative to the first output signal OUT1<n>, the second output signal OUT2<n> and the third output signal OUT3<n> outputted by the $n^{th}$ stage of the shift register unit GOA<n>.

In some embodiments, for the case where, for example, the gate driving circuit 300 shown in FIG. 8 is provided with a sensing control function, that is, the gate driving circuit 300 adopts a shift register unit provided with a third control circuit as described above with reference to FIGS. 5 to 7, the control method according to an embodiment of the present disclosure may further include step S203. In step S203, a first control signal OE is applied to the first control signal terminal Ctrl of each shift register unit, and a second control signal CLKs is applied to the second control signal terminal Ctr2, so that in response to the input signal (for example CR<n−1>) and the second control signal CLKs applied to one of the shift register units (for example the $n^{th}$ stage of the shift register unit GOA<n>) in the display phase being both at a high level, the shift register unit (for example, the $n^{th}$ stage of the shift register unit GOA<n>) generates a first output signal, a second output signal, and a third output signal as sensing control signals in the blanking phase.

Although the method steps are described above in a specific order, those skilled in the art should understand that the operation sequence of the control method of the embodiments of the present disclosure is not limited to this, for example, steps S201 to S203 may be performed simultaneously or in other orders.

The control method of the gate driving circuit according to the embodiment of the present disclosure will be described in detail below with reference to FIGS. 14 and 15.

Figure 14:
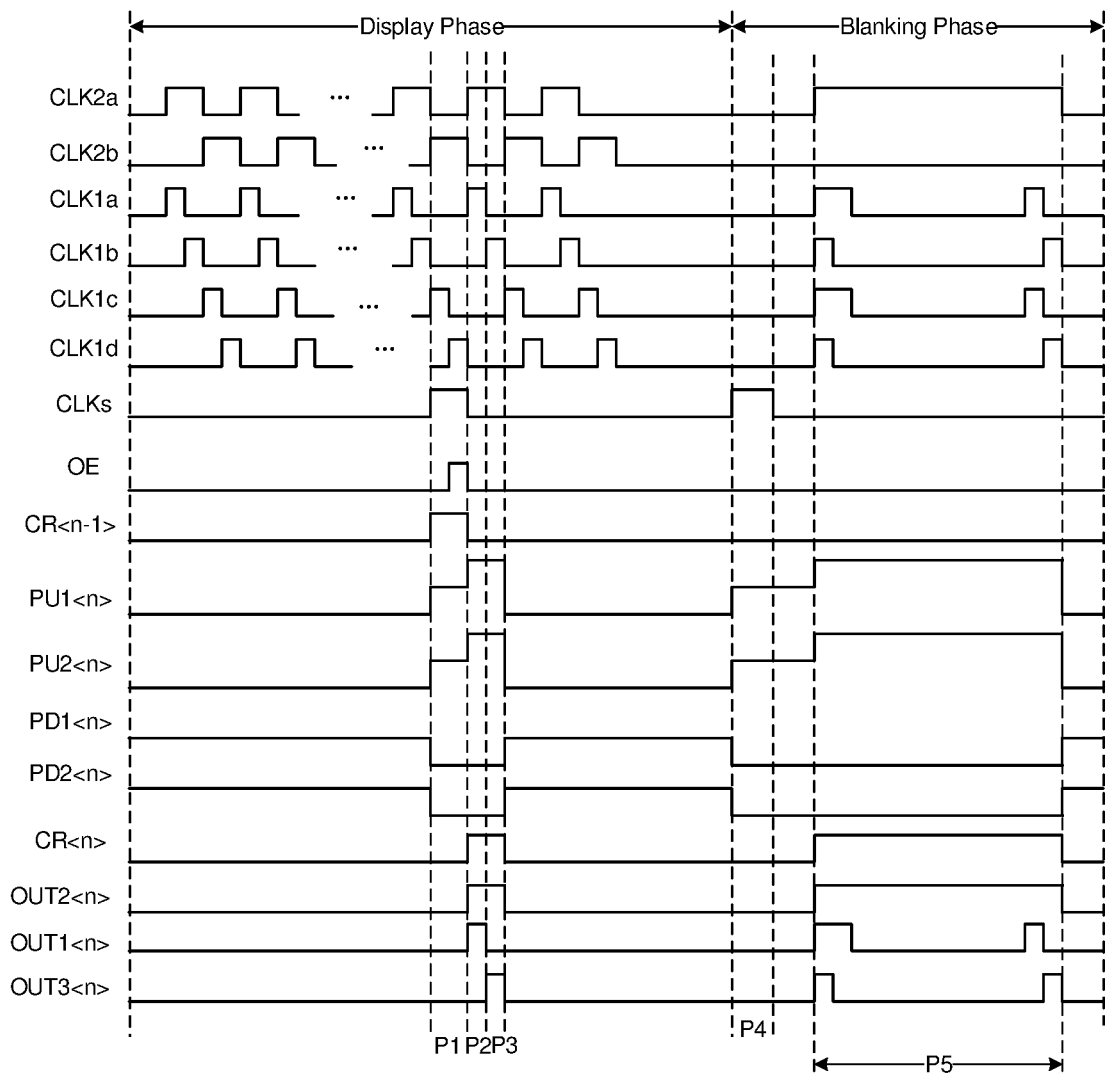
FIG. 14 shows a signal timing diagram of a gate driving circuit according to an embodiment of the present disclosure.

FIG. 14 shows a signal timing diagram of the gate driving circuit according to an embodiment of the present disclosure. This signal timing can be applied to the gate driving circuit described above, for example, the gate driving circuit 300 described above with reference to FIG. 8, wherein the gate driving circuit 300 has a sensing control function, that is, the gate driving circuit 300 adopts a shift register unit provided with a third control circuit, for example, the shift register unit described above with reference to FIGS. 5 to 7. In this embodiment, the second control signal CLKs may be a random pulse during the display phase and a frame frequency periodic pulse (for example, as a start pulse) during the blanking phase. The second control signal CLKs can also be generated by calculation. The first control signal OE is a strobe signal. The low level of the first control signal OE is lower than the low levels of the input signal and the second control signal. For example, the high level of the first control signal OE is 24V and the low level is −24V; the high level of other signals in FIG. 14 is 24 v and the low level is −6V.

In the display phase, similar to the clock signal terminals CLK1, CLK2, and CLK3 of FIG. 12, the first clock signal CLK1a, the second clock signal CLK2a, and the third clock signal CLK1b are pulse signals with the same period, and the pulse width of the first clock signal CLK1a and the third clock signal CLK1b is half of the pulse width of the second clock signal CLK2a. The fifth clock signal CLK2b has the same waveform as the second clock signal CLK2a and has a half-cycle shift relative to the second clock signal CLK2a, and the fourth clock signal CLK1c has the same waveform as the first clock signal CLK1a and has a half-cycle shift relative to the first clock signal CLK1a, and the sixth clock signal CLK1d has the same waveform as the third clock signal CLK1b and has a half-cycle shift relative to the third clock signal CLK1b. In the display phase, each shift register unit operates in the manner described with reference to FIGS. 11 and 12. In the example of FIG. 14, each shift register unit has the structure described above with reference to FIGS. 5 to 7, and each shift register unit can work in the manner described above with reference to FIG. 12, and details are not repeated here.

In the blanking phase, the first control signal OE is at a third level (for example, −24V), the fourth clock signal CLK1c is the same as the first clock signal CLK1a, and the sixth clock signal CLK1d is the same as the third clock signal CLK1b. Each shift register unit operates in the manner described with reference to FIG. 12 and will not be repeated here.

Taking the gate driving circuit described with reference to FIG. 8 and the shift register unit described with reference to FIG. 6 as examples, the sensing control (also referred to as random sensing) of the gate driving circuit according to an embodiment of the present disclosure will be described in conjunction with FIG. 14.

As shown in FIG. 14, during the display phase (for example, in the first period P1), the second control signal CLKs and the input signal terminal CR<n−1> of the n$^{th}$ stage of the shift register unit GOA<n> in the N stages of the shift register unit are both at a high level, this means that the n$^{th}$ stage of the shift register unit GOA<n> is selected to generate the sensing signal. During this period (for example, in the period P12), the first control signal OE is at a high level (for example, 24V), so that the transistor T8 of the shift register unit GOA<n> is turned on, and the high level (for example, 24V) of the input signal terminal CR<n−1> is written into the first end of the capacitor Cs through the transistor T8 (and thus into the gate of the transistor T7 of the shift register unit GOA<n>), and the high level of the second control signal CLKs is written into the second end of the capacitor Cs. This causes the capacitor Cs to store the voltage across it, so that the potential of the gate of the transistor T7 of the shift register unit GOA<n> will follow the potential of the second control signal Clks. However, for the other stages of the shift register unit (for example, shift register unit GOA<n+1>) in the gate driving circuit, since their input signal terminals are all at a low level (for example, −6V), the second clock signal CLKs is at a low level (for example, −6V), and the first control signal is at a low level (for example, −24V), and both the transistors T7 and T8 are turned off, and the gate of the transistor T7 is floating.

After the end of the first period, for example in the second period P2, the second control signal CLKs changes from being at a high level (for example, 24V) to being at a low level (for example, −6V), so that the gate of the transistor T7 of the shift register unit GOA<n> changes from being at a high level (for example, 24V) to being at low level (for example, −6V). The gates of the transistors T7 of the other stages of the shift register unit in the gate driving circuit are still floating.

In the blanking phase, the first control signal OE is at a low level, the transistor T8 is turned off, and in the fourth period P4, the second control signal terminal Ctr2 changes from being at a low level (for example, −6V) to being at a high level (for example, 24V). At this time, the gate of the transistor T7 of the shift register unit GOA<n> also changes from being at a low level (for example, −6V) to a high level (for example, 24V), and the transistor T7 is turned on, thereby the high level of the second control signal CLKs is written into the pull-up nodes PU1 and PU2 of the shift register unit GOA<n> to charge the capacitors C1 and C2 of the shift register unit GOA<n> for subsequent writing a clock signal into the output signal terminal in the fifth period P5. For the other stages of the shift register units, due to the presence of the capacitor Cs, the second control signal CLKs changes from being at a low level (for example, −6V) to being at a high level (for example, 24V), so that the gates of the transistors T7 of the other stages of the shift register unit change from being at a low level (for example, −6V) to being at a lower level (for example, −30V), the transistors T7 of the other stages of the shift register unit are turned off, and it is not possible to write high levels into the pull-up nodes PU1 and PU2. At this time, since the first control signal OE is at a lower third level (for example, −24V), a lower level (for example, about −20V) can be stored at the gate of the transistor T7, thereby ensuring that the transistor T7 is in turn-off state.

In the fifth period P5, the potentials of the pull-up nodes PU1 and PU2 cause the shift register unit GOA<n> to generate the first output signal, the second output signal, and the third output signal according to the signals of the first clock signal terminal CLK1, the second clock signal terminal CLK2, and the third clock signal terminal CLK3, respectively. For example, in the shift register unit GOA<n>, the presence of the capacitors C1 and C2 keeps the pull-up nodes PU1 and PU2 to be at a high level after the fourth period P4, so that when the subsequent high level of the clock signal arrives in the fifth period P5, the high level of the clock signal is output through the corresponding output signal terminal. However, the pull-up nodes PU1 and PU2 of the other shift register units in the gate driving circuit are not written with a high level in the fourth period, therefore the output signal cannot be generated in the fifth period P5.

Figure 15:
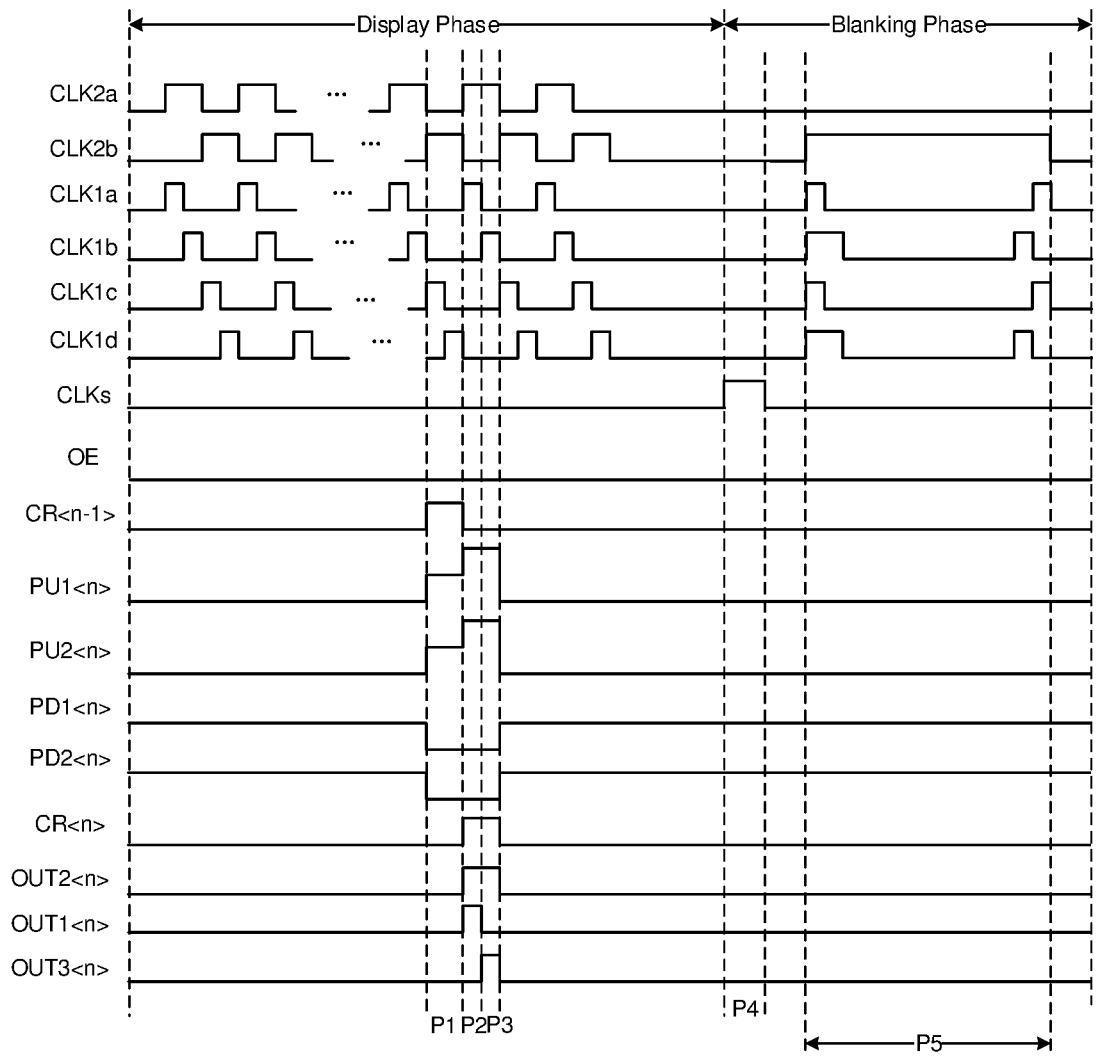
FIG. 15 shows a signal timing diagram of a gate driving circuit according to another embodiment of the present disclosure.

FIG. 15 shows a signal timing diagram of a gate driving circuit according to another embodiment of the present disclosure. FIG. 15 shows the signal timing of adjacent frames (for example, the next frame) with respect to one frame shown in FIG. 14. It can be seen that in the next frame shown in FIG. 15, the signal timing of the display phase is basically the same as the display stage of FIG. 14, the difference is mainly that the signal waveform of the blanking phase in the next frame is different from that of FIG. 14. For the sake of brevity, the following mainly describes the differences in detail.

As shown in FIGS. 14 and 15, relative to the blanking phase of the current frame of FIG. 14, in the blanking phase of the next frame shown in FIG. 15, the waveform of the fifth clock signal CLK2b and the waveform of the second clock signal CLK2a are interchanged, the waveform of the fourth clock signal CLK1c and the waveform of the sixth clock signal CLK1d are interchanged, and the waveform of the first clock signal CLK1a and the waveform of the third clock signal CLK1b are interchanged. For example, the waveform of the second clock signal CLK2a in the blanking phase of FIG. 14 is the same as the waveform of the fifth clock signal CLK2b in the blanking phase of FIG. 15, and the waveform of the fifth clock signal CLK2b in the blanking phase of FIG. 14 is the same as the waveform of the second clock signal CLK2a in the blanking phase of FIG. 15.

In the fifth period P5 of one frame shown in FIG. 14, the fifth clock signal CLK2b is at the second level, and the fourth clock signal CLK1c is at the first level in the beginning phase of the fifth period P5 and in the ending phase of the fifth period, and the sixth clock signal CLK1d is at the first level in the first half of the beginning phase of the fifth period P5 and in the second half of the ending phase of the fifth period P5. The second clock signal CLK2a is at the first level, the first clock signal CLK1a is the same as the fourth clock signal CLK1c, and the third clock signal CLK1b is the same as the sixth clock signal CLK1d.

In the fifth period P5 of the adjacent frame shown in FIG. 15, the fifth clock signal CLK2b is at the first level, and the sixth clock signal CLK1d is at the first level in the beginning phase of the fifth period P5 and in the first half of the ending phase of the fifth period, and the fourth clock signal CLK1c is at the first level in the first half of the beginning phase of the fifth period P5 and the second half of the ending phase of the fifth period. The second clock signal CLK2a is at a second level, the first clock signal CLK1a is the same as the fourth clock signal CLK1c, and the third clock signal CLK1b is the same as the sixth clock signal CLK1d.

It can be seen that in the next frame shown in FIG. 15, the n$^{th}$ stage of the shift register unit GOA<n> is not selected in the display phase, that is, the second control signal CLKs which is at a high level as the input signal terminal CR<n−1> does not appear in the display phase. Therefore, the n$^{th}$ stage of the shift register unit GOA<n> does not generate output signals during the blanking phase, that is, the first output signal OUT1<n> and the second output signal OUT2<n> and the third output signal OUT3<n> are both at a low level.

The specific embodiments described above further describe the purpose, technical solution and beneficial effects of the embodiments of the present disclosure in detail. It should be understood that the above are only specific embodiments of the embodiments of the present disclosure and are not intended to be used to limit this disclosure. Any modifications, equivalent replacements, improvements, etc. made within the spirit and principles of this disclosure should be included in the scope of protection of this disclosure.

What is claimed is:

1. A shift register unit, comprising:
   a first shift register coupled to an input signal terminal, a first clock signal terminal and a second clock signal terminal, and configured to generate a first output signal based on a signal at the first clock signal terminal and generate a second output signal based on a signal at the second clock signal terminal under a control of a signal at the input signal terminal; and
   a second shift register coupled to the input signal terminal and a third clock signal terminal, and configured to generate a third output signal based on a signal at the third clock signal terminal under the control of the signal at the input signal terminal;
   wherein a pull-up node of the first shift register is coupled to a pull-up node of the second shift register,
   wherein the first shift register comprises:
   a first control circuit coupled to the input signal terminal and a reset signal terminal, and configured to control a potential at the pull-up node of the first shift register and a potential at a pull-down node of the first shift register according to a signal at the input signal terminal and a signal at the reset signal terminal;
   a first output circuit coupled to the first clock signal terminal, the pull-up node of the first shift register, and the pull-down node of the first shift register, and configured to generate the first output signal based on the signal at the first clock signal terminal under a control of the potential at the pull-up node of the first shift register and the potential at the pull-down node of the first shift register; and
   a second output circuit coupled to the second dock signal terminal, the pull-up node of the first shift register, and the pull-down node, of the first shift register, and configured to generate the second output signal based on a signal at the second clock signal terminal under the control of the potential at the pull-up node of the first shift register and the potential at the pull-down node of the first shift register.

2. The shift register unit according to claim 1, wherein the first output circuit comprises a first transistor and a second transistor, wherein,
   a gate of the first transistor is coupled to the pull-up node of the first shift register, a first electrode of the first transistor is coupled to the first clock signal terminal, and a second electrode of the first transistor is coupled to a first output signal terminal for outputting the first output signal,
   a gate of the second transistor is coupled to the pull-down node of the first shift register, a first electrode of the second transistor is coupled to a reference signal terminal, and a second electrode of the second transistor is coupled to the first output signal terminal;
   the second output circuit comprises a third transistor and a fourth transistor, wherein,
   a gate of the third transistor is coupled to the pull-up node of the first shift register, a first electrode of the third transistor is coupled to the second clock signal terminal, and a second electrode of the third transistor is coupled to a second output signal terminal for outputting the second output signal,
   a gate of the fourth transistor is coupled to the pull-down node of the first shift register, a first electrode of the fourth transistor is coupled to the reference signal terminal, and a second electrode of the fourth transistor is coupled to the second output signal terminal.

3. The shift register unit according to claim 1, wherein the second shift register comprises:
   a second control circuit coupled to the input signal terminal and a reset signal terminal, and configured to control a potential at the pull-up node of the second shift register and a potential at a pull-down node of the second shift register according to a signal at the input signal terminal and a signal at the reset signal terminal; and a third output circuit coupled to the third clock signal terminal, the pull-up node of the second shift register, and the pull-down node of the second shift register, and configured to generate the third output signal based on a signal at the third clock signal terminal under a control of the potential at the pull-up node of the second shift register and the potential at the pull-down node of the second shift register.

4. The shift register unit according to claim 3, wherein the third output circuit comprises a fifth transistor and a sixth transistor,
a gate of the fifth transistor is coupled to the pull-up node of the second shift register, a first electrode of the fifth transistor is coupled to the third clock signal terminal, and a second electrode of the fifth transistor is coupled to a third output signal terminal for outputting the third output signal,
a gate of the sixth transistor is coupled to the pull-down node of the second shift register, a first electrode of the sixth transistor is coupled to a reference signal terminal, and a second electrode of the sixth transistor is coupled to the third output signal terminal.

5. The shift register unit according to claim 1, further comprising: a third control circuit coupled to a first control signal terminal, a second control signal terminal, and the input signal terminal, and configured to control a potential at the pull-up node of the first shift register and a potential at the pull-up node of the second shift register under a control of a signal at the input signal terminal, a signal at the first control signal terminal and a signal at the second control signal terminal.

6. The shift register unit according to claim 5, wherein the third control circuit comprises a seventh transistor, an eighth transistor, and a capacitor,
wherein a gate of the seventh transistor is coupled to a first end of the capacitor, a first electrode of the seventh transistor is coupled to the second control signal terminal and a second end of the capacitor, a second electrode of the seventh transistor is coupled to the pull-up node of the first shift register and the pull-up node of the second shift register, and a gate of the eighth transistor is coupled to the first control signal terminal, a first electrode of the eighth transistor is coupled to the input signal terminal, and a second electrode of the eighth transistor is coupled to the gate of the seventh transistor; or
wherein a first end of the capacitor is coupled to the second control signal terminal, and a second end of the capacitor is coupled to a gate of the seventh transistor, a first electrode of the seventh transistor is coupled to a power signal terminal, and a second electrode of the seventh transistor is coupled to the pull-up node of the first shift register and the pull-up node of the second shift register, a gate of the eighth transistor is coupled to the first control signal terminal, a first electrode of the eighth transistor is coupled to the input signal terminal, and a second electrode of the eighth transistor is coupled to the gate of the seventh transistor.

7. A gate driving circuit comprising N stages of cascaded shift register units according to claim 1, wherein,
an input signal terminal of a $n^{th}$ stage of the shift register unit is coupled to a second output signal terminal of a $(n-1)^{th}$ stage of the shift register unit, and a reset signal terminal of the $n^{th}$ stage of the shift register unit is coupled to a second output signal terminal of a $(n+1)^{th}$ stage of the shift register unit, wherein, n and N are integers, N≥4, and 2≤n≤N−1; and the N stages of cascaded shift register units comprises multiple groups of shift register units, and each group of shift register units comprises a first shift register unit, a second shift register unit, a third shift register unit, and a fourth shift register unit being cascaded, wherein,
a first clock signal terminal of the second shift register unit and a first clock signal terminal of the fourth shift register unit are coupled to receive a first clock signal, and a second clock signal terminal of the second shift register unit and a second clock signal terminal of the fourth shift register unit are coupled to receive a second clock signal, a third clock signal terminal of the second shift register unit and a third clock signal terminal of the fourth shift register unit are coupled to receive a third clock signal; and
a first clock signal terminal of the first shift register unit and a first clock signal terminal of the third shift register unit are coupled to receive a fourth clock signal, a second clock signal terminal of the first shift register unit and a second clock signal terminal of the third shift register unit are coupled to receive a fifth clock signal, a third clock signal terminal of the first shift register unit and a third clock signal terminal of the third shift register unit are coupled to receive a sixth clock signal.

8. A display apparatus comprising the gate driving circuit according to claim 7.

9. The display apparatus according to claim 8, further comprising a plurality of pixel units arranged in 2*N rows, each pixel unit having a first control terminal and a second control terminal, wherein,
a $n^{th}$ stage of the shift register unit is coupled to a $(2n-1)^{th}$ row of the pixel unit and a $2n^{th}$ row of the pixel unit, wherein a first output signal terminal of the $n^{th}$ stage of the shift register unit is coupled to a first control terminal of the $(2n-1)^{th}$ row of the pixel unit, a second output signal terminal of the $n^{th}$ stage of the shift register unit is coupled to a second control terminal of the $(2n-1)^{th}$ row of the pixel unit and a second control terminal of the $2n^{th}$ row of the pixel unit, a third output signal terminal of the $n^{th}$ stage of the shift register unit is coupled to a first control terminal of the $2n^{th}$ row of the pixel unit.

10. A method of a gate driving circuit according to claim 7, comprising: applying a first clock signal, a second clock signal, a third clock signal, a fourth clock signal, a fifth clock signals, and a sixth clock signal to the gate driving circuit, so that each shift register unit generates a first output signal, a second output signal, and a third output signal, wherein,
the first output signal, the second output signal, and the third output signal generated by a $(n+1)^{th}$ stage of the shift register unit are respectively shifted relative to the first output signal, the second output signal, and the third output signal generated by a $n^{th}$ stage of the shift register unit; and
the second output signal generated by each shift register unit coincides with an overlapping of the first output signal and the third output signal generated by the same shift register unit.

11. The method according to claim 10, wherein, in a display phase,
the first clock signal, the second clock signal and the third clock signal are pulse signals having the same period, and both a pulse width of the first clock signal and a pulse width the third clock signal are half of a pulse width of the second clock signal;

a waveform of the fifth clock signal is the same as a waveform of the second clock signal, and the fifth clock signal has a half-cycle shift relative to the second clock signal;

a waveform of the fourth clock signal is the same as a waveform of the first clock signal, and the fourth clock signal has a half-cycle shift relative to the first clock signal; and a waveform of the sixth clock signal is the same as a waveform of the third clock signal, and the sixth clock signal has a half-cycle shift relative to the third clock signal.

12. The method according to claim 11, wherein, for each shift register unit, the display phase comprises a first period, a second period, and a third period, wherein in the first period, a input signal terminal is at a first potential to pull up a potential at a pull-up node of the first shift register and a potential at a pull-up node of the second shift register to the first potential;

in the second period, a first clock signal terminal and a second clock signal terminal are at the first potential, and the potential at the pull-up node of the first shift register causes the first shift register to output the first output signal at a first level and the second output signal at the first level;

in the third period, the second clock signal terminal is at the first potential, a potential at the first clock signal terminal changes from the first potential to a second potential, and the third clock signal terminal is at the first potential, so that the potential at the pull-up node of the first shift register causes the first shift register to output the second output signal at the first level and the first output signal at a second level, and the potential at the pull-up node of the second shift register causes the second shift register to output the third output signal at the first level.

13. The method according to claim 11, wherein each shift register unit further comprises a third control circuit, the method further comprising: applying a first control signal and a second control signal to the third control circuit of each shift register unit, so that in response to a input signal and the second control signal applied to one of the shift register units being at a first level at the same time in the display phase, the shift register unit is controlled to generate the first output signal, the second output signal, and the third output signal as sensing control signals in a blanking phase, wherein for each shift register unit, in the display phase, in at least a portion of the period that a input signal terminal and a second control signal terminal are both at a first potential, a first control signal terminal is at the first potential, so that the third control circuit of the shift register unit stores voltage; and in the blanking phase, the third control circuit of the shift register unit uses the stored voltage to control the shift register unit to generate the first output signal, the second output signal, and the third output signal as sensing control signals.

14. The method according to claim 13, wherein the blanking phase comprises a fourth period and a fifth period, and the shift register unit is controlled to generate a first output signal, a second output signal, and a third output signal as sensing control signals in the blanking phase comprising: for the shift register unit, in the fourth period of the blanking phase, the second control signal is at the first level, and the first control signal is at a third level lower than a second level, so that the third control circuit of the shift register unit uses the stored voltage to pull up both a potential at a pull-up node of the first shift register and a potential at a pull-up node of the second shift register of the shift register unit to the first potential;

in the fifth period of the blanking phase, the second control signal is at the second level, the first control signal is at the third level lower than the second level, and the potential at pull-up node of the first shift register causes the first shift register to output a signal at the first clock signal terminal as the first output signal and a signal at the second clock signal terminal as the second output signal, and the potential at the pull-up node of the second shift register causes the second shift register to output a signal at the third clock signal terminal as the third output signal, wherein in the fifth period of the blanking phase of one frame of two adjacent frames, the fifth clock signal is at the second level, the fourth clock signal is at the first level in a beginning phase of the fifth period and in a first half of a ending phase of the fifth period, and the sixth clock signal is at the first level in a first half of the beginning phase of the fifth period and a second half of the ending phase of the fifth period, the second clock signal is at the first level, the first clock signal is the same as the fourth clock signal, and the third clock signal is the same as the sixth clock signal; and in the fifth period of the blanking phase of the other frame of two adjacent frames, the fifth clock signal is at the first level, the sixth clock signal is at the first level in the beginning phase of the fifth period and in the first half of the ending phase of the fifth period, and the fourth clock signal is at the first level in the first half of the beginning phase of the fifth period and in the second half of the ending phase of the fifth period, the second clock signal is at the second level, the first clock signal is the same as the fourth clock signal, and the third clock signal is the same as the sixth clock signal.

15. A method of controlling a shift register unit according to claim 1, comprising:

applying an input signal to an input signal terminal, applying a first clock signal to a first clock signal terminal, and applying a second clock signal to a second clock signal terminal, so that a first shift register generates a first output signal based on the first clock signal and generates a second output signal based on the second clock signal under the control of the input signal; and applying a third clock signal to a third clock signal terminal, so that a second shift register generates a third output signal based on the third clock signal under the control of the input signal.

16. The method according to claim 15, wherein, in a display phase, the first clock signal, the second clock signal, and the third clock signal are pulse signals having the same period, and both a pulse width of the first clock signal and a pulse width of the third clock signal are half of a pulse width of the second clock signal, so that the second output signal generated by the shift register unit coincides with an overlapping of the first output signal and the third output signal.

17. The method according to claim 16, wherein the display phase comprises a first period, a second period, and a third period, wherein
- during the first period, the input signal is at a first level so as to pull up both a potential at a pull-up node of the first shift register and a potential at a pull-up node of the second shift register to a first potential;
- during the second period, the first clock signal and the second clock signal are at the first level, and the potential at the pull-up node of the first shift register causes the first shift register to output the first output signal at the first level and the second output signal at the first level; and
- during the third period, the second clock signal is at the first level, the first clock signal changes from being at the first level to being at a second level, and the third clock signal is at the first level, the potential at the pull-up node of the first shift register causes the first shift register to output the second output signal at the first level and the first output signal at a second level, and the potential at the pull-up node of the second shift register causes the second shift register to output the third output signal at the first level.

18. The method according to claim 16, wherein the shift register unit further comprises a third control circuit,
- the method further comprising: applying a first control signal to a first control signal terminal, and applying a second control signal to a second control signal terminal, so that in response to the input signal and the second control signal being at a first level at the same time in the display phase, the shift register unit is controlled to generate the first output signal, the second output signal and the third output signal as sensing control signals in a blanking phase, wherein in the display phase, in at least a portion of the period that the input signal and the second control signal are both at the first level, the first control signal is at the first level, so that the third control circuit stores voltage; and in the blanking phase, the third control circuit uses the stored voltage to control the shift register unit to generate the first output signal, the second output signal, and the third output signal as sensing control signals.

19. The method according to claim 18, wherein the blanking phase comprises a fourth period and a fifth period, and the shift register unit is controlled to generate the first output signal, the second output signal, and the third output signal as sensing control signals in the blanking phase comprising:
- in the fourth period of the blanking phase, the second control signal is at the first level, and the first control signal is at a third level lower than the second level, so that the third control circuit uses the stored voltage to pull up a potential at a pull-up node of the first shift register and a potential at a pull-up node of the second shift register to the first potential;
- in the fifth period of the blanking phase, the second control signal is at the second level, the first control signal is at the third level lower than the second level, and the potential at the pull-up node of the first shift register causes the first shift register to output a signal at the first clock signal terminal as the first output signal and a signal at the second clock signal terminal as the second output signal, and the potential at the pull-up node of the second shift register causes the second shift register to output a signal at the third clock signal terminal as the third output signal, wherein a duration of the fourth period is greater than a duration of a first period.

* * * * *